United States Patent
Kasahara et al.

(10) Patent No.: US 11,930,594 B2
(45) Date of Patent: Mar. 12, 2024

(54) ADHESIVE FILM FOR MULTILAYER PRINTED-WIRING BOARD

(71) Applicant: HITACHI CHEMICAL COMPANY, LTD., Tokyo (JP)

(72) Inventors: Aya Kasahara, Tokyo (JP); Yasuyuki Mizuno, Tokyo (JP); Hikari Murai, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 16/325,493

(22) PCT Filed: Aug. 15, 2016

(86) PCT No.: PCT/JP2016/073843
§ 371 (c)(1),
(2) Date: Feb. 14, 2019

(87) PCT Pub. No.: WO2018/033950
PCT Pub. Date: Feb. 22, 2018

(65) Prior Publication Data
US 2019/0230790 A1    Jul. 25, 2019

(51) Int. Cl.
| H05K 1/03 | (2006.01) |
| C09J 163/00 | (2006.01) |
| H05K 3/38 | (2006.01) |
| H05K 3/46 | (2006.01) |

(52) U.S. Cl.
CPC ......... *H05K 1/0373* (2013.01); *C09J 163/00* (2013.01); *H05K 3/38* (2013.01); *H05K 3/4626* (2013.01)

(58) Field of Classification Search
None
See application file for complete search history.

(56) References Cited

U.S. PATENT DOCUMENTS

| 6,562,179 B1 * | 5/2003 | Ikeguchi | C08G 59/4014 523/442 |
| 2002/0009577 A1 * | 1/2002 | Takaya | H03H 7/09 428/209 |
| 2004/0256731 A1 | 12/2004 | Mao et al. | |
| 2008/0145689 A1 * | 6/2008 | Ogawa | H05K 3/386 428/607 |
| 2009/0302462 A1 * | 12/2009 | Hosomi | H05K 1/0366 156/247 |
| 2013/0146344 A1 * | 6/2013 | Lee | C08L 67/00 174/258 |
| 2018/0171135 A1 | 6/2018 | Kasahara | |

FOREIGN PATENT DOCUMENTS

| CN | 102134377 A | 7/2011 |
| JP | H06-329973 A | 11/1994 |
| JP | H08-34832 A | 2/1996 |
| JP | 2002-179774 A | 6/2002 |
| JP | 2006-527920 A | 12/2006 |
| JP | 2007-087982 A | 4/2007 |
| JP | 2009-280758 A | 12/2009 |
| JP | 2010-090237 A | 4/2010 |
| JP | 2012-045887 A | 3/2012 |
| JP | 2013-040298 A | 2/2013 |
| JP | 2013-091781 A | 5/2013 |
| JP | 2014-107295 A | 6/2014 |
| JP | 2016-060881 A | 4/2016 |
| KR | 10-2012-0021243 A | 3/2012 |
| TW | 201213112 A1 | 4/2012 |

OTHER PUBLICATIONS

English language machine translation of JP 2013-040298. Printed Mar. 17, 2021. Original document published Feb. 28, 2013 (Year: 2013).*

Takahashi et al., JP 2012-045887 A machine translation in English, Mar. 8, 2012 (Year: 2012).

Zidong Li, Preparation of cyanate resin), New Times Press, Jan. 31, 2001 (cited in an office action dated Jul. 27, 2021 in corresponding Chinese patent app. 201680088444.2).

* cited by examiner

*Primary Examiner* — Megan McCulley
(74) *Attorney, Agent, or Firm* — FITCH, EVEN, TABIN & FLANNERY, LLP

(57) ABSTRACT

The present invention relates to an adhesive film for a multilayer printed-wiring board, in which a property of filling irregularities is excellent even when silica filler is highly filled. Specifically, there is provided an adhesive film for a multilayer printed-wiring board, which includes a resin composition layer that is obtained by forming a layer of a resin composition containing: (A) a novolac type phenolic resin in which a dispersity (Mw/Mn) of a weight average molecular weight (Mw) and a number average molecular weight (Mn) ranges from 1.05 to 1.8; (B) an epoxy resin represented by general formula (1); and (C) inorganic filler, on a support film. An average particle size of the (C) inorganic filler in the resin composition layer is 0.1 μm or more, and a content of the (C) inorganic filler in a resin solid content ranges from 20% to 95% by mass.

17 Claims, No Drawings

ADHESIVE FILM FOR MULTILAYER PRINTED-WIRING BOARD

CROSS-REFERENCE TO RELATED APPLICATIONS

This application is a U.S. national phase application filed under 35 U.S.C. § 371 of International Application No. PCT/JP2016/073843, filed Aug. 15, 2016, designating the United States, which is hereby incorporated herein by reference in its entirety.

TECHNICAL FIELD

The present invention relates to an adhesive film for a multilayer printed-wiring board.

BACKGROUND ART

In recent years, for a multilayer printed-wiring board to be used for electronic devices and communication devices, there is a growing demand for acceleration of an arithmetic processing speed as well as miniaturization, weight reduction, and high density wiring. Accordingly, as a method of producing a multilayer printed-wiring board, a technique for a build-up-type manufacturing in which interlayer insulating layers are alternately stacked on a wiring layer of a circuit board attracts attention.

In the build-up-type manufacturing technique, as a production method of an interlayer insulating layer and a wiring layer, a method of forming wiring using a so-called "subtractive method" has been conventionally common, in which a resin composition for forming an interlayer insulating layer (hereinafter, also referred to as "a resin composition for an interlayer insulating layer") and copper foil for forming a wiring layer are pressurized at a high temperature for a long time by means of a press machine such that the resin composition for the interlayer insulating layer is thermally cured, to thereby obtain the interlayer insulating layer having the copper foil, and then, as necessary, via holes for interlayer connection are formed according to a drilling method or a laser method, and subsequently, the copper foil is removed by etching while necessary portions are left.

However, along with the above-described demands for miniaturization, weight reduction, and high density wiring with respect to the multilayer printed-wiring board, a so-called "additive method" is attracting attention, in which after a resin composition for an interlayer insulating layer and copper foil are pressurized at a high temperature for a short time by means of a vacuum laminator, the resin composition for the interlayer insulating layer is thermally cured at a high temperature by means of a dryer or the like, and then, as necessary, via holes for interlayer connection are formed according to a drilling method or a laser method, and a wiring layer is formed at a necessary portion according to a plating method.

As a resin composition for an interlayer insulating layer, which is used in a build-up method, an aromatic epoxy resin and a curing agent having an active hydrogen to the epoxy resin (for example, a phenol-based curing agent, an amine-based curing agent, a carboxylic acid-based curing agent) are mainly used in combination. A cured product obtained through curing with these curing agents is excellent in balance of physical properties, but has a problem in that an increase in water absorption rate and a deterioration of electrical characteristics such as relative permittivity and dielectric loss tangent are caused because a highly polar hydroxy group is generated due to a reaction between an epoxy group and the active hydrogen. Further, the use of these curing agents causes a problem that the storage stability of a resin composition is impaired.

Meanwhile, it is known that a cyanate compound having a thermosetting cyanato group provides a cured product excellent in electrical characteristics. However, a reaction in which the cyanate group forms an S-triazine ring on thermosetting requires a relatively long time of curing at a high temperature, that is, at 230° C. for 120 min or more, and thus is not suitable as a resin composition for an interlayer insulating layer for a multilayer printed-wiring board which is produced by the above-described build-up method.

As a method of lowering the curing temperature of the cyanate compound, there is known a method in which a cyanate compound and an epoxy resin are used in combination and a curing catalyst is used for curing (see, e.g., PTL 1 and 2)

Further, since a build-up layer is required to have a low coefficient of thermal expansion (low CTE) due to a demand for a processing dimensional stability and a reduction in a warp amount after semiconductor mounting, an effort to lower CTE has been conducted (see, e.g., PTL 3 to 5). As the most mainstream method, in many cases, silica filler is highly filled (for example, 40% by mass or more of silica filler in the build-up layer) so as to lower CTE of the build-up layer.

CITATION LIST

Patent Literature

PTL 1: JP 2013-40298A
PTL 2: JP 2010-90237A
PTL 3: JP 2006-527920A
PTL 4: JP 2007-87982A
PTL 5: JP 2009-280758A

SUMMARY OF INVENTION

Technical Problem

[a] When silica filler is highly filled in order to lower CTE of a build-up layer, filling irregularities of a wiring pattern of an inner layer circuit, with a build-up material, tends to be difficult. Further, it is required to fill an inner layer circuit such as a through hole, with a build-up material, so as to reduce irregularities. When the silica filler is highly filled in order to lower CTE of the build-up material, satisfying these requirements tends to be difficult.

A first invention has been made to solve these problems, and an object thereof is to provide an adhesive film for a multilayer printed-wiring board, in which the property of filling irregularities is excellent even when silica filler is highly filled.

[b] Further, an object of a second invention is to provide an interlayer insulating resin film and an adhesion auxiliary layer-attached interlayer insulating resin film, which are capable of providing an interlayer insulating layer that is excellent in adhesiveness to a circuit board even after an accelerated environmental test, and is excellent in a low thermal expansion property, a heat resistance, and a dielectric property, and a printed wiring board obtained by using the interlayer insulating resin film or the adhesion auxiliary layer-attached interlayer insulating resin film.

Solution to Problem

[a] As a result of repetitive intensive studies to solve the first problem, the present inventors have found that it is possible to solve the first problem by using a resin composition containing a specific novolac type phenolic resin, a specific epoxy resin, and a specific inorganic filler, and then have completed the present invention. That is, the first invention provides the following adhesive film.

(1) An adhesive film for a multilayer printed-wiring board, including a resin composition layer that is obtained by forming a layer of a resin composition containing: (A) a novolac type phenolic resin in which a dispersity (Mw/Mn) of a weight average molecular weight (Mw) and a number average molecular weight (Mn) ranges from 1.05 to 1.8; (B) an epoxy resin represented by the following general formula (1); and (C) inorganic filler, on a support film, wherein an average particle size of the (C) inorganic filler in the resin composition layer is 0.1 μm or more, and a content of the (C) inorganic filler in a resin solid content ranges from 20% to 95% by mass:

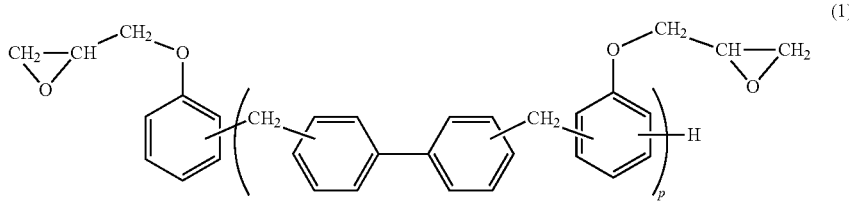

(1)

wherein p represents an integer of 1 to 5.

[b] Further, as a result of pursuing of studies to solve the above-described problem, the present inventors found that it is possible to solve the corresponding problem by the following present invention. That is, the present invention provides the following [1] to [7].

[1] An interlayer insulating resin film containing an epoxy resin (A), a cyanate resin (B), and dicyandiamide (C).

[2] The interlayer insulating resin film described in the above [1], which further contains inorganic filler (D).

[3] The interlayer insulating resin film described in the above [2], in which the inorganic filler (D) is silica.

[4] The interlayer insulating resin film described in any one of the above [1] to [3], in which a content of the dicyandiamide (C) ranges from 0.005 to 5.0 parts by mass based on a total of 100 parts by mass of the epoxy resin (A) and the cyanate resin (B) in terms of solid content.

[5] An adhesion auxiliary layer-attached interlayer insulating resin film that is an interlayer insulating resin film attached with an adhesion auxiliary layer, in which the adhesion auxiliary layer is formed on one surface of the interlayer insulating resin film described in any one of the above [1] to [4], and the corresponding adhesion auxiliary layer contains an epoxy resin (a), a cyanate resin (b), and an inorganic filler (c).

[6] The adhesion auxiliary layer-attached interlayer insulating resin film described in the above [5], in which a support is further formed on the surface of the adhesion auxiliary layer opposite to the surface on which the interlayer insulating resin film is formed.

[7] A printed wiring board obtained by using the interlayer insulating resin film described in any one of the above [1] to [4], or the adhesion auxiliary layer-attached interlayer insulating resin film described in the above [5] or [6].

Advantageous Effects of Invention

[a] According to the first invention, it is possible to provide an adhesive film for a multilayer printed-wiring board, in which the property of filling irregularities is excellent even when silica filler is highly filled.

[b] According to the second invention, it is possible to provide an interlayer insulating resin film and an adhesion auxiliary layer-attached interlayer insulating resin film, which are capable of providing an interlayer insulating layer that is excellent in adhesiveness to a circuit board even after an accelerated environmental test, and is excellent in a low thermal expansion property, a heat resistance, and a dielectric property, and a printed wiring board obtained by using the interlayer insulating resin film or the adhesion auxiliary layer-attached interlayer insulating resin film.

DESCRIPTION OF EMBODIMENTS

[a] First Invention

An adhesive film for a multilayer printed-wiring board according to the present invention is an adhesive film for a multilayer printed-wiring board which includes a resin composition layer that is obtained by forming a layer of a resin composition (hereinafter, also referred to as "a resin composition for an adhesive film") containing (A) a novolac type phenolic resin in which a dispersity (Mw/Mn) of a weight average molecular weight (Mw) and a number average molecular weight (Mn) ranges from 1.05 to 1.8 (hereinafter, also simply referred to as "(A) a novolac type phenolic resin"), (B) an epoxy resin represented by the above general formula (1) (hereinafter, also simply referred to as "(B) an epoxy resin"), and (C) inorganic filler, on a support film, in which in the resin composition layer, an average particle size of (C) the inorganic filler is 0.1 μm or more, and the content of (C) the inorganic filler in a resin solid content ranges from 20% to 95% by mass.

[Resin Composition for Adhesive Film]

The resin composition for the adhesive film contains (A) the novolac type phenolic resin, (B) the epoxy resin, and (C) the inorganic filler. Hereinafter, each of these components will be described.

<(A) Novolac Type Phenolic Resin>

(A) The novolac type phenolic resin is used as a curing agent of an epoxy resin, in which a dispersity (Mw/Mn) of a weight average molecular weight (Mw) and a number average molecular weight (Mn) ranges from 1.05 to 1.8.

(A) The novolac type phenolic resin may be produced by a production method described in, for example, JP 4283773B.

That is, a phenol compound and an aldehyde compound as raw materials, a phosphoric acid compound as an acid catalyst, and a non-reactive oxygen-containing organic solvent as a reaction auxiliary solvent are used, and then a two-layer separation state formed from these is mixed by, for example, mechanical stirring or ultrasonic waves. In an emulsified heterogeneous reaction system where two layers (an organic phase and an aqueous phase) are mixed (a phase separation reaction), a reaction between the phenol compound and the aldehyde compound proceeds to thereby synthesize a condensate (resin).

Next, for example, a water-insoluble organic solvent (for example, methyl ethyl ketone, methyl isobutyl ketone) is added and mixed, thereby dissolving the above condensate, and then mixing is stopped. The resultant is allowed to stand so that separation into an organic phase (an organic solvent phase) and an aqueous phase (a phosphoric acid aqueous solution phase) is made. The aqueous phase is removed for recovery. Meanwhile, regarding the organic phase, after hot water washing and/or neutralization, the organic solvent is recovered by distillation so as to produce (A) the novolac type phenolic resin.

Since the above-described production method of the novolac type phenolic resin utilizes a phase separation reaction, stirring efficiency is very important, and it is preferable to increase the surface area of an interface as much as possible by refining both phases in the reaction system from the viewpoint of reaction efficiency. This promotes conversion of the phenol compound into the resin.

Examples of the phenol compound used as the raw material include phenol, ortho-cresol, meta-cresol, para-cresol, xylenol, bisphenol compounds, an ortho-substituted phenol compound having a hydrocarbon group having three or more carbon atoms, preferably 3 to 10 carbon atoms at an ortho position, and a para-substituted phenol compound having a hydrocarbon group having three or more carbon atoms, preferably 3 to 18 carbon atoms at a para position. These may be used alone or in combination of two or more thereof.

Here, examples of the bisphenol compound include bisphenol A, bisphenol F, bis(2-methylphenol) A, bis(2-methylphenol) F, bisphenol S, bisphenol E, and bisphenol Z.

Examples of the ortho-substituted phenol compound include 2-propylphenol, 2-isopropylphenol, 2-sec-butylphenol, 2-tert-butylphenol, 2-phenylphenol, 2-cyclohexylphenol, 2-nonylphenol, and 2-naphthylphenol.

Examples of the para-substituted phenol compound include 4-propylphenol, 4-isopropylphenol, 4-sec-butylphenol, 4-tert-butylphenol, 4-phenylphenol, 4-cyclohexylphenol, 4-nonylphenol, 4-naphthylphenol, 4-dodecylphenol, and 4-octadecylphenol.

Examples of the aldehyde compound used as the raw material include formaldehyde, formalin, para formaldehyde, trioxane, acetaldehyde, paraldehyde, and propionaldehyde. Among these, from the viewpoint of a reaction rate, para formaldehyde is preferable. These may be used alone or in combination of two or more thereof.

A blending molar ratio (F/P) of the aldehyde compound (F) and the phenol compound (P) is preferably 0.33 or more, more preferably ranges from 0.40 to 1.0, and further preferably from 0.50 to 0.90. When the blending molar ratio (F/P) falls within the above range, an excellent yield may be obtained.

The phosphoric acid compound used as the acid catalyst serves an important role of forming a place for a phase separation reaction with the phenol compound in the presence of water. As the phosphoric acid compound, for example, an aqueous solution type, such as 89 mass % phosphoric acid, 75 mass % phosphoric acid, may be used. Further, if necessary, for example, polyphosphoric acid or phosphoric acid anhydride may be used.

From the viewpoint of controlling the phase separation effect, the content of the phosphoric acid compound is, for example, 5 or more parts by mass, preferably 25 or more parts by mass, and more preferably 50 to 100 parts by mass based on 100 parts by mass of phenol compound. When 70 or more parts by mass of phosphoric acid compound is used, it is preferable to secure safety by suppressing heat generation at the beginning of reaction through introduction into the reaction system in a division manner.

The non-reactive oxygen-containing organic solvent as the reaction auxiliary solvent serves a very important role in promoting the phase separation reaction. As the reaction auxiliary solvent, it is preferable to use at least one type of compound selected from the group including an alcohol compound, a polyhydric alcohol-based ether, a cyclic ether compound, a polyhydric alcohol-based ester, a ketone compound, and a sulfoxide compound.

Examples of the alcohol compound include a monohydric alcohol such as methanol, ethanol, propanol, a dihydric alcohol such as butanediol, pentanediol, hexanediol, ethylene glycol, propylene glycol, trimethylene glycol, diethylene glycol, dipropylene glycol, triethylene glycol, tripropylene glycol, polyethylene glycol, and a trihydric alcohol such as glycerin.

Examples of the polyhydric alcohol-based ether include ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethyl methyl ether, and ethylene glycol ether.

Examples of the cyclic ether compound include 1,3-dioxane and 1,4-dioxane and examples of the polyhydric alcohol-based ester include a glycol ester compound such as ethylene glycol acetate. Examples of the ketone compound include acetone, methyl ethyl ketone (hereinafter, also referred to as "MEK"), and methyl isobutyl ketone, and examples of the sulfoxide compound include dimethyl sulfoxide, and diethyl sulfoxide.

Among these, ethylene glycol monomethyl ether, polyethylene glycol, and 1,4-dioxane are preferable.

The reaction auxiliary solvent is not limited to the above-described examples, but may be a solid as long as the above-described characteristics are exhibited and a liquid state is exhibited at the time of reaction, and may be used alone or in combination of two or more thereof. The blending amount of the reaction auxiliary solvent is not particularly limited, but is, for example, 5 or more parts by mass, and preferably ranges from 10 to 200 parts by mass based on 100 parts by mass of phenol compound.

During the above-described heterogeneous reaction step, a surfactant may be further used so that it is possible to promote the phase separation reaction, to shorten a reaction time, and to contribute to improvement in yield.

Examples of the surfactant include: an anionic surfactant such as soap, alpha olefin sulfonate, alkyl benzene sulfonic acid and salt thereof, alkyl sulfate ester salt, alkyl ether sulfate ester salt, phenyl ether ester salt, polyoxyethylene alkyl ether sulfate ester salt, ether sulfonate, ether carboxylate; a non-ionic surfactant such as polyoxyethylene alkylphenyl ether, polyoxyalkylene alkyl ether, polyoxyethylene styrenated phenol ether, polyoxyethylene alkyl amino ether, polyethylene glycol aliphatic ester, aliphatic monoglyceride, sorbitan aliphatic ester, pentaerythritol aliphatic ester, polyoxyethylene polypropylene glycol, aliphatic alkylol amide; and a cationic surfactant such as monoalkyl ammonium chloride, dialkyl ammonium chloride, amine acid salt compound.

The blending amount of the surfactant is not particularly limited, but is, for example, 0.5 or more parts by mass, and preferably ranges from 1 to 10 parts by mass based on 100 parts by mass of phenol compound.

The amount of water in the reaction system affects the phase separation effect, and the production efficiency, but is generally 40% by mass or less on the basis of mass. By setting the amount of water to 40% by mass or less, the production efficiency may be kept good.

The temperature of the reaction between the phenol compound and the aldehyde compound varies according to the type of the phenol compound, and the reaction condition, and is not particularly limited, but is generally 40° C. or more, preferably 80° C. to a reflux temperature, and more preferably a reflux temperature. When the reaction temperature is 40° C. or more, it is possible to obtain a sufficient reaction rate. The reaction time varies according to the reaction temperature, the blending amount of the phosphoric acid, and the water content in the reaction system, but generally ranges from about 1 to 10 hours.

Further, the reaction environment is generally atmospheric pressure, but a reaction may be carried out under pressure or under reduced pressure from the viewpoint of maintaining a heterogeneous reaction that is a characteristic of the present invention. For example, under pressure of 0.03 to 1.50 MPa, the reaction rate may be increased, and further, it becomes possible to use a low boiling point solvent such as methanol, as the reaction auxiliary solvent.

By the above-described production method of (A) the novolac type phenolic resin, it is possible to produce a novolac type phenolic resin in which a dispersity (Mw/Mn) of a weight average molecular weight (Mw) and a number average molecular weight (Mn) ranges from 1.05 to 1.8.

For example, it is possible to obtain the following (A) novolac type phenolic resin according to the range of a blending molar ratio (F/P) of the aldehyde compound (F) and the phenol compound (P), which varies depending on the type of the phenol compound.

When the blending molar ratio (F/P) has a range of 0.33 or more and less than 0.80, it is possible to produce a novolac type phenolic resin at high yield, in which in a measurement method by an area method of gel permeation chromatography (GPC), the content of a monomer component in the phenol compound is, for example, 3% by mass or less, and preferably 1% by mass or less, and the content of a dimer component in the phenol compound ranges, for example, from 5% to 95% by mass, and preferably from 10% to 95% by mass, and further, in the GPC measurement, a dispersity (Mw/Mn) of a weight average molecular weight (Mw) and a number average molecular weight (Mn) ranges from 1.05 to 1.8, and preferably from 1.1 to 1.7.

As (A) the novolac type phenolic resin, a commercial product may be used, and examples thereof include "PAPS-PN2" (manufactured by Asahi Yukizai Corporation, product name), and "PAPS-PN3" (manufactured by Asahi Yukizai Corporation, product name).

In the resin composition for the adhesive film, an epoxy resin curing agent (hereinafter, also simply referred to as an "epoxy resin curing agent") other than (A) the novolac type phenolic resin may be used in combination as long as the effect of the present invention is not impaired.

Examples of the epoxy resin curing agent include various phenolic resin compounds other than (A) the novolac type phenolic resin, acid anhydride compounds, amine compounds, and hydrazide compounds. Examples of the phenolic resin compound include a novolac type phenolic resin other than (A) the novolac type phenolic resin, and a resol type phenolic resin, and examples of the acid anhydride compound include phthalic anhydride, benzophenone tetracarboxylic dianhydride, and methyl hymic acid. Further, examples of the amine compound include dicyandiamide, diaminodiphenyl methane, and guanylurea.

Among these epoxy resin curing agents, from the viewpoint of improving reliability, the novolac type phenolic resin other than (A) the novolac type phenolic resin is preferable.

Further, from the viewpoint of improving the peeling strength of a metal foil and the peeling strength of electroless plating after chemical roughening, triazine ring-containing novolac type phenolic resin and dicyandiamide are preferable.

As the novolac type phenolic resin other than (A) the novolac type phenolic resin, a commercial product may be used, and examples thereof include a phenol novolac resin such as "TD2090" (manufactured by DIC corporation, product name), and a cresol novolac resin such as "KA-1165" (manufactured by DIC corporation, product name). Further, examples of a commercial product of the triazine ring-containing novolac type phenolic resin include "Fenolite LA-1356" (manufactured by DIC corporation, product name), and "Fenolite LA7050 series" (manufactured by DIC corporation, product name), and examples of a commercial product of a triazine-containing cresol novolac resin include "Fenolite LA-3018" (product name, manufactured by DIC corporation).

<(B) Epoxy Resin>

(B) The epoxy resin is an epoxy resin represented by the following general formula (1).

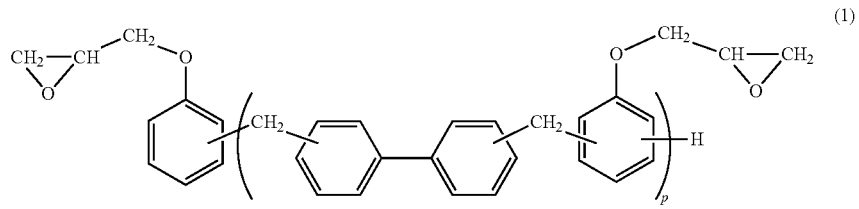

(1)

(In the formula, p represents an integer of 1 to 5.)

As (B) the epoxy resin, a commercial product may be used. Examples of (B) the epoxy resin as the commercial product include "NC-3000" (an epoxy resin having p of 1.7 in the formula (1)), and "NC-3000-H" (an epoxy resin having p of 2.8 in the formula (1)) (both are manufactured by Nippon Kayaku Co., Ltd., product names).

The resin composition for the adhesive film may contain an epoxy resin other than (B) the epoxy resin, or a polymer type epoxy resin such as a phenoxy resin as long as the effect of the present invention is not impaired.

<Curing Accelerator>

The resin composition for the adhesive film may contain a curing accelerator from the viewpoint of accelerating a reaction between (A) the novolac type phenolic resin and (B) the epoxy resin. Examples of the curing accelerator include an imidazole compound such as 2-phenylimidazole, 2-ethyl-4-methylimidazole, or 1-cyanoethyl-2-phenyl imidazolium trimellitate; an organic phosphorus compound such as triphenylphosphine; an onium salt such as phosphonium borate; amines such as 1,8-diazabicyloundecene; and 3-(3,4-dichlorophenyl)-1,1-dimethyl urea. These may be used alone or in combination of two or more thereof.

<(C) Inorganic Filler>

The resin composition for the adhesive film contains (C) the inorganic filler having an average particle size of 0.1 μm or more.

Examples of (C) the inorganic filler include silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, bismuth titanate, titanium oxide, barium zirconate, and calcium zirconate. These may be used alone or in combination of two or more thereof. Among these, from the viewpoint of lowering a thermal expansion coefficient of an interlayer insulating layer formed by curing the adhesive film, silica is preferable.

The shape of (C) the inorganic filler is not particularly limited, but a spherical shape is preferable from the viewpoint of easily filling up a through hole formed in an inner layer circuit and irregularities of a circuit pattern.

The average particle size of (C) the inorganic filler is 0.1 μm or more, and is preferably 0.2 μm or more, and more preferably 0.3 μm or more from the viewpoint of obtaining an excellent filling property.

The content of inorganic filler having an average particle size of less than 0.1 μm is preferably 3 vol % or less and more preferably 1 vol % or less (solid content) from the viewpoint of a filling property, and it is more preferable that inorganic filler having an average particle size of less than 0.1 μm is not contained. One type of (C) inorganic filler may be used alone, and ones having different average particle sizes may be used in combination.

As (C) the inorganic filler, a commercial product may be used. Examples of (C) the inorganic filler as the commercial product include "SO-C1" as spherical silica (average particle size: 0.25 μm), "SO-C2" (average particle size: 0.5 μm), "SO-C3" (average particle size: 0.9 μm), "SO-C5" (average particle size: 1.6 μm), and "SO-C6" (average particle size: 2.2 μm) (all manufactured by Admatechs Co., Ltd.).

(C) The inorganic filler may be one that is subjected to a surface treatment. For example, when silica is used as (C) the inorganic filler, a silane coupling agent treatment may be carried out as surface treatment. Examples of the silane coupling agent include an aminosilane coupling agent, a vinyl silane coupling agent, and an epoxysilane coupling agent. Among these, silica subjected to a surface treatment with an aminosilane coupling agent is preferable.

The amount of (C) the inorganic filler in the resin composition for the adhesive film is defined as follows. First, a resin composition formed as a layer on a support film is dried at 200° C. for 30 min so that a solvent contained in the resin composition is removed, and the weight (solid content) after the solvent is removed is measured. The amount of (C) the inorganic filler contained in the solid content is defined as an amount of (C) the inorganic filler in a resin solid content.

Further, in a measurement method of (C) the inorganic filler, when the amount of the solid content of (C) the inorganic filler to be blended in advance is calculated, it is possible to easily obtain the ratio in the solid content. In the case where (C) the inorganic filler dispersed in the solvent (hereinafter, also referred to as "(C) an inorganic filler dispersion") is used, a calculation example is described below.

After drying at 200° C. for 30 min, the calculation result of the solid content of (C) the inorganic filler in (C) the inorganic filler dispersion was 70% by mass. After 40 g of (C) inorganic filler dispersion was used in blending with the resin composition, the total amount of the obtained resin composition was 100 g. After 100 g of resin composition was dried at 200° C. for 30 min, the measurement result of the weight of the dried solid content was 60 g. Since the amount of (C) the inorganic filler contained in a resin solid content is 28 g (=40 g×70% by mass), the amount of (C) the inorganic filler in a resin solid content is obtained as 47% by mass (28/60=46.6% by mass).

The more the amount of (C) the inorganic filler in the resin composition for the adhesive film, the more preferable from the viewpoint of lowering a thermal expansion coefficient of an interlayer insulating layer after thermosetting. Meanwhile, from the viewpoint of filling up irregularities and a through hole in a wiring pattern of an inner layer circuit board to be formed, there is a proper amount of inorganic filler. From this viewpoint, the content of (C) the inorganic filler in a resin solid content ranges from 20% to 95% by mass, preferably from 30% to 90% by mass, and more preferably from 50% to 90% by mass. When the content of (C) the inorganic filler is 20% by mass or more, the thermal expansion coefficient may be lowered, and in the case of 95% by mass or less, the filling property may be kept good.

<Flame Retardant>

The resin composition for the adhesive film may further contain a flame retardant.

The flame retardant is not particularly limited, but examples thereof include an inorganic flame retardant, and a resin flame retardant. Examples of the inorganic flame retardant include aluminum hydroxide and magnesium hydroxide which are exemplified as (C) the inorganic filler.

The resin flame retardant may be a halogen resin or a non-halogen resin, but it is preferable to use a non-halogen resin in consideration of environmental burden. The resin flame retardant may be blended as filler, or may have a functional group reactive with a thermosetting resin.

As the resin flame retardant, a commercial product may be used. Examples of a commercial product of the resin flame retardant to be blended as a filler include "PX-200" as an aromatic phosphoric acid ester-based flame retardant (manufactured by Daihachi Chemical Industry Co., Ltd., product name), and "Exolit OP 930" as a polyphosphate compound (manufactured by Clariant Japan Co., Ltd., product name).

As a commercial product of the resin flame retardant having a functional group reactive with a thermosetting resin, an epoxy-based phosphorus-containing flame retardant, and a phenol-based phosphorus-containing flame retardant are exemplified. Examples of the epoxy-based phosphorus-containing flame retardant include "FX-305" (manufactured by Nippon Steel Sumikin Chemical Co., Ltd., product name), and examples of the phenol-based phosphorus-containing flame retardant include "HCA-HQ" (manufactured by Sanko Co., Ltd., product name), and "XZ92741" (manufactured by Dow•Chemical Company, product name). These may be used alone or in combination of two or more thereof.

<Solvent>

It is preferable that the resin composition for the adhesive film contains a solvent from the viewpoint of efficiently performing layer formation. Examples of the solvent include: ketone compounds such as acetone, methyl ethyl ketone, methyl isobutyl ketone, and cyclohexanone; acetate ester compounds such as ethyl acetate, butyl acetate, cellosolve acetate, propylene glycol monomethyl ether acetate, and carbitol acetate; carbitol compounds such as cellosolve, methyl carbitol, and butyl carbitol; aromatic hydrocarbon compounds such as toluene and xylene; dimethyl formamide, dimethyl acetamide, N-methyl pyrrolidone, diethylene glycol dimethyl ether, and propylene glycol monomethyl ether. These may be used alone or in combination of two or more thereof.

<Residual Solvent Amount>

The residual solvent amount in the adhesive film of the present invention depends on the materials to be handled, but is preferably in a range of from 1% to 20% by mass, more preferably from 2% to 15% by mass, and further preferably from 2% to 10% by mass, which varies depending on the material to be handled. When the residual solvent amount is 1% by mass or more, the handling property of the adhesive film is improved, and for example, occurrence of powder falling and occurrence of cracking at the time of cutting with a cutter can be suppressed. Meanwhile, in the case of 20% by mass or less, sticking is suppressed, and this allows the film to be easily wound up and rolled up. Furthermore, in order to enable unrolling, after drying, a protective film is often formed on a varnish applied surface of the adhesive film. In such a case, when the residual solvent amount is 20% by mass or less, peeling between the protective film and the adhesive film of the present invention becomes easy.

Further, since the residual solvent is removed by drying and thermosetting in a process of producing a multilayer printed-wiring board, it is preferable that the amount id small from the viewpoint of an environmental load, and it is also preferable that the amount is small for reducing the change in a film thickness before and after drying and thermosetting.

In the production of the adhesive film of the present invention, it is preferable to determine a drying condition such that the target residual solvent amount is obtained. The drying condition varies according to the type of the solvent contained in the above-described resin composition, and the amount of the solvent, and therefore, is preferably determined by performing condition setting by a coating apparatus to be used in each case in advance.

Here, the residual solvent amount in the present invention is a ratio of a solvent (% by mass) contained in the resin composition layer on the support film, and may be defined as follows.

First, the weight (Wa) of the support film is measured, and the weight (Wb) after the resin composition layer is formed thereon is measured. Then, the support film and the resin composition layer formed thereon are left at rest within a dryer at 200° C. for 10 min, and then, the weight (Wc) after drying is measured. By using the obtained weights (Wa) to (Wc), calculation may be made by the following equation.

The ratio of the solvent (% by mass)=$(1-((Wc)-(Wa))/((Wb)-(Wa)))\times 100$

<Other Components>

The adhesive film of the present invention may contain other components as long as the effect of the present invention is not impaired. Examples of other components include: a thickener such as orben and bentone; a thiazole-based and triazol-based UV absorber; an adhesion imparting agent such as a silane coupling agent; a coloring agent such as phthalocyanine blue, phthalocyanine green, iodine green, disazo yellow, and carbon black; and an arbitrary resin component other than the above.

[Support Film]

The support film in the present invention functions as a support when the adhesive film of the present invention is produced, and is usually finally peeled off or removed when a multilayer printed-wiring board is produced.

The support film is not particularly limited, but examples thereof include an organic resin film, a metal foil, and a release paper.

As a material for the organic resin film, polyolefins such as polyethylene and polyvinyl chloride; polyesters such as polyethylene terephthalate (hereinafter, also referred to as "PET") and polyethylene naphthalate; polycarbonate, and polyimide are exemplified. Among these, from the viewpoint of a price and a handling property, PET is preferable.

As the metal foil, a copper foil and an aluminum foil are exemplified. When the copper foil is used as the support, a circuit may also be formed by using the copper foil, as it is, as a conductor layer. In this case, as the copper foil, rolled copper, electrolytic copper foil or the like may be used. Further, the thickness of the copper foil is not particularly limited, but, for example, one having a thickness ranging from 2 μm to 36 μm may be used. When a copper foil having a small thickness is used, a copper foil with an attached carrier may be used from the viewpoint of improving workability.

These support films and the protective film to be described below may be subjected to a surface treatment such as a release treatment, a plasma treatment, or a corona treatment. As the release treatment, release treatments with a silicone resin releasing agent, an alkyd resin releasing agent, and a fluororesin releasing agent are exemplified.

The thickness of the support film is not particularly limited, but preferably ranges from 10 μm to 120 μm, more preferably from 15 μm to 80 μm, and further preferably from 15 μm to 70 μm, from the viewpoint of the handling property.

The support film does not need to have a single component as described above, but may be formed of different materials in a plurality of layers (two or more layers).

As a support film with a two-layer structure, there may be exemplified an example in which, as a support film for the first layer, the support film exemplified above is used, and as a second layer, a layer formed of an epoxy resin, a curing agent for the epoxy resin, a filler and the like is provided. As materials used for the second layer, materials exemplified as the materials used for the adhesive film of the present invention may also be used.

A layer (second or subsequent layers, there may be a plurality of layers (two or more layers)) formed on the first layer for the support film is a layer that is produced with intent to impart a function, and may be used for the purpose of, for example, improvement of adhesiveness to a plated copper.

A method of forming the second layer is not particularly limited, but, for example, a method in which a varnish prepared by dissolving and dispersing respective materials in a solvent is applied on the first layer for the support film and then dried is exemplified.

When the support film is formed with a plurality of layers, the thickness of the first layer for the support film preferably ranges from 10 μm to 100 μm, more preferably 10 μm to 60 μm, and further preferably 13 μm to 50 μm.

The thickness of the layer formed on the first layer for the support film (second or subsequent layers, there may be a plurality of layers (two or more layers)) preferably ranges from 1 μm to 20 μm. In the case of 1 μm or more, an intended function may be fulfilled, and further, in the case of 20 μm or less, economic efficiency as a support film is excellent.

In the case where the support film is formed with a plurality of layers, when the support film is peeled off, a layer (which may be two or more layers) that is to be left on the multilayer printed-wiring board side together with the adhesive film of the present invention and a layer (which may be two or more layers) that is to be peeled off or removed may be present separately.

[Protective Film]

The adhesive film of the present invention may include a protective film. The protective film is formed on the surface of the adhesive film, which is opposite to the surface on which the support is formed, and is used for the purpose of preventing adhesion of foreign matter to the adhesive film and occurrence of scratches. The protective film is peeled off before the adhesive film of the present invention is laminated on a circuit board by lamination or heat-press.

The protective film is not particularly limited, but the same material as that for the support film may be used. The thickness of the protective film is not particularly limited, but, for example, one having a thickness ranging from 1 μm to 40 μm may be used.

[Method for Producing Adhesive Film]

The adhesive film of the present invention may be produced by applying and drying the resin composition for the adhesive film on the support film. The obtained adhesive film may be wound in a roll form, and saved and stored. More specifically, for example, the above respective resin components are dissolved in the above organic solvent, and then mixed with (C) the inorganic filler to prepare a resin composition for the adhesive film. The varnish is applied on the support film, and then subjected to heating or hot air blowing to dry the organic solvent. As described above, the adhesive film can be produced by forming the resin composition layer on the support film.

With respect to the adhesive film of the present invention, the resin composition layer formed on the support film may be in an uncured state obtained by drying, or in a semi-cured (B-staged) state.

A method of applying the varnish on the support film is not particularly limited, but, for example, a method of applying by using a conventionally known coating apparatus such as a comma coater, a bar coater, a kiss coater, a roll coater, a gravure coater, or a die coater is employed. The coating apparatus may be properly selected according to a target film thickness.

[b] Second Invention

Next, an interlayer insulating resin film, an adhesion auxiliary layer-attached interlayer insulating resin film, and a printed wiring board related to the second invention will be described.

[Interlayer Insulating Resin Film]

The interlayer insulating resin film of the present invention contains an epoxy resin (A), a cyanate resin (B), and a dicyandiamide (C).

<Epoxy Resin (A)>

The epoxy resin (A) is not particularly limited, and examples thereof include a bisphenol A type epoxy resin, a bisphenol F type epoxy resin, a bisphenol S type epoxy resin, a phenol novolac type epoxy resin, a cresol novolac type epoxy resin, a biphenyl type epoxy resin, an aralkyl type epoxy resin, a naphthol type epoxy resin, an anthracene type epoxy resin, a dicyclopentadiene type epoxy resin, a naphthalene type epoxy resin, a fluorine type epoxy resin, and a xanthene type epoxy resin. These epoxy resins (A) may be used alone or in combination of two or more thereof.

From the viewpoint of heat resistance, insulation reliability, and adhesiveness to a circuit board, the epoxy resin (A) may be a novolac type epoxy resin, a bisphenol F type epoxy resin, a naphthalene type epoxy resin, or an aralkyl type epoxy resin, or may be a naphthalene type epoxy resin or an aralkyl type epoxy resin. The naphthalene type epoxy resin and the aralkyl type epoxy resin may be used in combination. The aralkyl type epoxy resin may be an aralkyl type epoxy resin represented by the following general formula (1).

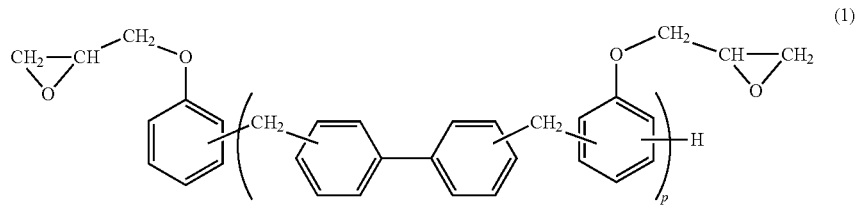

(n represents a number of 1 to 10.)

When the naphthalene type epoxy resin and the aralkyl type epoxy resin are contained in combination, the content ratio (naphthalene type epoxy resin/aralkyl type epoxy resin) preferably ranges from 15/85 to 50/50, more preferably from 15/85 to 45/55, and further preferably from 30/70 to 45/55 from the viewpoint of heat resistance, insulation reliability, and adhesiveness to a circuit board.

As the epoxy resin (A), a commercial product may be used. Examples of the commercial product include N-740 (epoxy equivalent 180), N-770 (epoxy equivalent 188), N-673 (epoxy equivalent 211), and N-830S (epoxy equivalent 168) (which are manufactured by DIC corporation, product names), and NC-7000L (epoxy equivalent 231), NC-3000H (epoxy equivalent 289), NC-3000L, NC-3000, NC-3100, and NC-2000L (epoxy equivalent 237) (which are manufactured by Nippon Kayaku Co., Ltd., product names).

From the viewpoint of heat resistance, insulation reliability, and adhesiveness to a circuit board, the epoxy equivalent of (a) the epoxy resin preferably ranges from 150 to 500 g/eq, more preferably from 150 to 400 g/eq, further preferably from 170 to 350 g/eq, and particularly preferably from 200 to 320 g/eq, and further, may range from 200 to 245 g/eq, and may range from 250 to 320 g/eq.

Here, the epoxy equivalent is a mass of a resin per epoxy group (g/eq), and may be measured according to a method prescribed in JIS K 7236 (2001). Specifically, 2 g of epoxy resin is weighed in a 200 ml beaker by using an automatic titration device "GT-200 type" (manufactured by Mitsubishi Chemical Analytech Co., Ltd.), and 90 ml of methyl ethyl ketone is added dropwise. After dissolution by an ultrasonic washer, measurement is made by adding 10 ml of glacial acetic acid and 1.5 g of cetyltrimethylammonium bromide, and titrating with 0.1 mol/L of perchloric acid/acetic acid solution.

The content of the epoxy resin (A) in the interlayer insulating resin film is not particularly limited, but may range from 5 parts to 30 parts by mass, or may range from 10 parts to 25 parts by mass based on 100 parts by mass of solid content contained in the interlayer insulating resin film.

When the content of the epoxy resin (A) is 5 parts by mass or more based on 100 parts by mass of solid content contained in the interlayer insulating resin film, the adhesiveness to a conductor layer tends to be improved. In the case of 30 parts by mass or less, the sufficient content of the cyanate resin (B) may be kept, and dielectric loss tangent tends to be reduced.

In the present specification, the solid content contained in the interlayer insulating resin film means a residue obtained by removing a volatile component from components constituting the interlayer insulating resin film.

<Cyanate Resin (B)>

The cyanate resin (B) is not particularly limited, and examples thereof include: bisphenol-type cyanate resins such as 2,2-bis(4-cyanatophenyl)propane [bisphenol A-type cyanate resin], bis(4-cyanatophenyl) ethane [bisphenol E-type cyanate resin], bis(3,5-dimethyl-4-cyanatophenyl)methane[tetramethyl bisphenol F-type cyanate resin], and 2,2-bis(4-cyanatophenyl)-1,1,1,3,3,3-hexafluoropropane [hexafluorobisphenol A-type cyanate resin]; dicyclopentadiene-type cyanate resins such as a cyanate ester compound of a phenol addition dicyclopentadiene polymer; novolac type cyanate resins such as a phenol novolac type cyanate ester compound and a cresol novolac type cyanate ester compound; α,α'-bis(4-cyanatophenyl)-m-diisopropyl benzene; and prepolymers of these cyanate resins (hereinafter, also referred to as "cyanate prepolymers"). These may be used alone or in combination of two or more thereof.

Among these, the cyanate resin (B) may be a bisphenol A-type cyanate resin or may be a prepolymer of a bisphenol A-type cyanate resin. Among these, from the viewpoint of heat resistance, insulation reliability, and adhesiveness to a circuit board, a cyanate resin represented by the following general formula (I), a cyanate resin represented by the following general formula (IV), and prepolymers of them are preferable, and a cyanate resin represented by the following general formula (I) and a prepolymer thereof are more preferable.

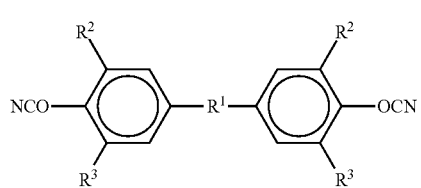

(I)

In the general formula (I), $R^1$ represents an alkylene group having 1 to 3 carbon atoms which may be substituted with a halogen atom, a sulfur atom, or a divalent group represented by the following general formula (II) or the following general formula (III). Each of $R^2$ and $R^3$ represents a hydrogen atom or an alkyl group having 1 to 4 carbon atoms. Plural $R^2$'s or $R^3$'s may be the same or different, but preferably the same.

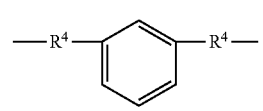

(II)

In the general formula (II), $R^4$ represents an alkylene group having 1 to 3 carbon atoms. Plural $R^4$'s may be the same or different, but preferably the same.

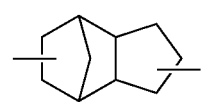

(III)

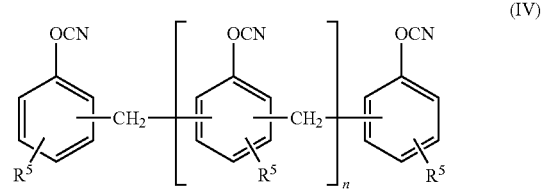

(IV)

In the general formula (IV), $R^5$ represents an alkyl group having 1 to 3 carbon atoms which may be substituted with a hydrogen atom or a halogen atom. n represents an integer of 1 or more. Plural $R^5$'s may be the same or different, but preferably the same.

In the general formula (I), as the alkylene group having 1 to 3 carbon atoms, which is represented by $R^1$, a methylene group, an ethylene group, a 1,2-propylene group, a 1,3-propylene group, and a 2,2-propylene group (—C(CH$_3$)$_2$—) are exemplified. Among these, from the viewpoint of heat resistance, insulation reliability, and adhesiveness to a circuit board, a methylene group or a 2,2-propylene group (—C(CH$_3$)$_2$—) is preferable, and a 2,2-propylene group (—C(CH$_3$)$_2$—) is more preferable.

As the halogen atom substituting for the alkylene group having 1 to 3 carbon atoms, a fluorine atom, a chlorine atom, a bromine atom, and an iodine atom are exemplified.

In the general formula (II), as the alkylene group having 1 to 3 carbon atoms, which is represented by $R^4$, a methylene group, an ethylene group, a 1,2-propylene group, a 1,3-propylene group, and a 2,2-propylene group (—C(CH$_3$)$_2$—) are exemplified.

From the viewpoint of heat resistance, insulation reliability, and adhesiveness to a circuit board, among these groups represented by $R^4$, a methylene group or a 2,2-propylene group (—C(CH$_3$)$_2$—) is preferable, and a 2,2-propylene group (—C(CH$_3$)$_2$—) is more preferable.

In the general formula (I), as the alkyl group having 1 to 4 carbon atoms, which is represented by $R^2$ or $R^3$, a methyl group, an ethyl group, a propyl group, and a butyl group are exemplified.

In the general formula (IV), as the alkyl group having 1 to 3 carbon atoms, which is represented by $R^5$, a methyl group, an ethyl group, and a propyl group are exemplified.

As the halogen atom substituting for the alkyl group having 1 to 3 carbon atoms, a fluorine atom, a chlorine atom, a bromine atom, and an iodine atom are exemplified.

In the general formula (IV), n represents an integer of 1 or more, and preferably ranges from 1 to 7, and more preferably from 1 to 4 from the viewpoint of heat resistance, insulation reliability, and adhesiveness to a circuit board.

The above-described cyanate prepolymer refers to a polymer in which cyanate resins form a triazine ring by a cyclization reaction, and mainly a trimer, a pentamer, a heptamer, a nonamer, and an undecamer of a cyanate ester compound are exemplified. In the cyanate prepolymer, the conversion rate of a cyanate group is not particularly limited, but preferably ranges from 20% to 70% by mass, and more preferably from 30% to 65% by mass from the viewpoint of obtaining good solubility in an organic solvent.

As the cyanate prepolymer, a prepolymer of the cyanate resin represented by the general formula (I), and a prepolymer of the cyanate resin represented by the general formula (IV) are exemplified. Among these, from the viewpoint of heat resistance, insulation reliability, and adhesiveness to a circuit board, a prepolymer of a dicyanate compound having two cyanate groups in one molecule is preferable, a prepolymer of the cyanate resin represented by the general formula (I) is more preferable, and a prepolymer in which at least a part of 2,2-bis(4-cyanatophenyl)propane is triazinated to form a trimer (see the following formula (V)) is further preferable.

weight average molecular weight is 4,500 or less, an increase of viscosity is suppressed, and then the workability tends to be excellent.

In the present invention, the weight average molecular weight (Mw) is measured using a standard polystyrene calibration curve by gel permeation chromatography (GPC) (manufactured by Tosoh Corporation), and in detail, is measured according to the method described in Examples described later.

The content of the cyanate resin (B) in the interlayer insulating resin film is not particularly limited, but may range from 2 to 50 parts by mass, may range from 4 to 40 parts by mass, may range from 5 to 30 parts by mass, may range from 5 to 20 parts by mass, or may range from 5 to 13 parts by mass based on 100 parts by mass of solid content contained in the interlayer insulating resin film. When the content of the cyanate resin (B) is 2 parts by mass or more based on 100 parts by mass of solid content contained in the interlayer insulating resin film, a good dielectric property, a heat resistance, and a low thermal expansion property tend to be obtained. In the case of 50 parts by mass or less, adhesiveness to a circuit board tends to be excellent after an accelerated environmental test.

<Dicyandiamide (C)>

The dicyandiamide (C) is represented by $H_2N-C(=NH)-NH-CN$, and the melting point usually ranges from 205° C. to 215° C., or from 207° C. to 212° C. in the case of a higher purity.

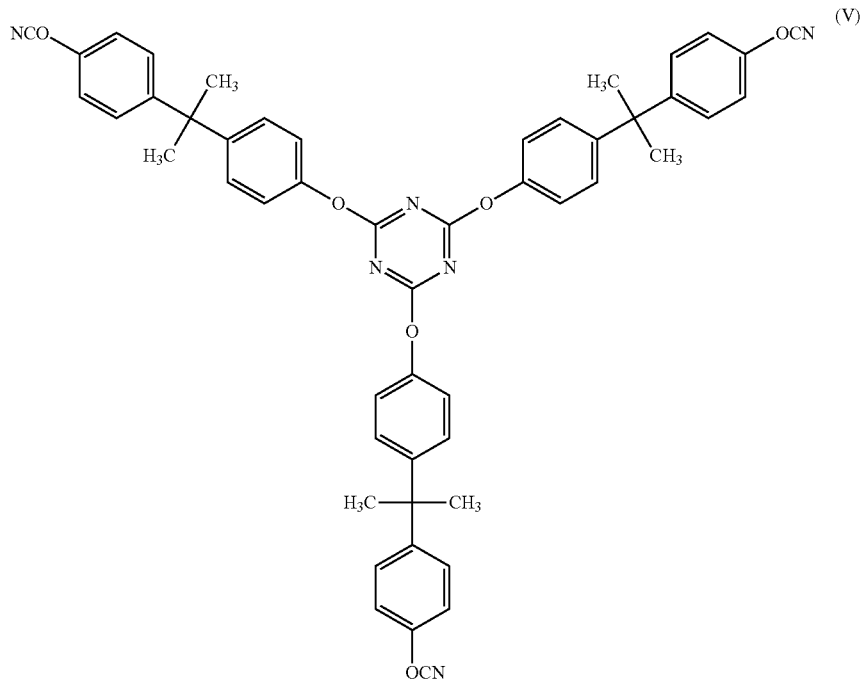

The weight average molecular weight of the cyanate resin (B) is not particularly limited, but may range from 200 to 4,500, may range from 300 to 3,000, may range from 500 to 2,000, or may range from 500 to 1,500. When the weight average molecular weight is 200 or more, the crystallization of the cyanate resin (B) is suppressed, and then the solubility in an organic solvent tends to be good. Further, when the The dicyandiamide (C) is a crystalline substance, and may be an orthorhombic crystal or a plate crystal. The dicyandiamide (C) preferably has a purity of 98% or more, more preferably a purity of 99% or more, and further preferably a purity of 99.4% or more.

As the dicyandiamide (C), a commercial product may be used, and, for example, commercial products from Nippon Carbide Industries Co., Inc., Tokyo Chemical Industry Co., Ltd., Kishida Chemical Co., Ltd., and Nacarai tesque Inc. may be used.

The content of the dicyandiamide (C) in the interlayer insulating resin film is not particularly limited, but may be 0.005 parts by mass or more, may be 0.01 parts by mass or more, may be 0.03 parts by mass or more, may be 0.25 parts by mass or more, or may be 0.5 parts by mass or more based on a total of 100 parts by mass of the epoxy resin (A) and the cyanate resin (B) in terms of solid content, from the viewpoint of preventing deterioration of adhesiveness to a circuit board after an accelerated environmental test. Further, the upper limit of the content of the dicyandiamide (C) may be 5.0 parts by mass or less, may be 3.0 parts by mass or less, or may be 1.5 parts by mass or less based on a total of 100 parts by mass of the epoxy resin (A) and the cyanate resin (B) in terms of solid content from the viewpoint of preventing precipitation of aggregates of the dicyandiamide (C) at the time of film applying, and deterioration of the dielectric property.

Further, as the content of the dicyandiamide (C) in the interlayer insulating resin film, the equivalent of the dicyandiamide (C) to the epoxy resin (A) [(blending amount of dicyandiamide (C)/active hydrogen equivalent of dicyandiamide (C))/(blending amount of epoxy resin (A)/epoxy equivalent of epoxy resin (A))] may range from 0.005 to 0.5, may range from 0.04 to 0.3, may range from 0.04 to 0.13, or may range from 0.08 to 0.13. When the equivalent is 0.005 or more, adhesiveness to a circuit board tends to be excellent after an accelerated environmental test, and in the case of 0.5 or less, the dielectric property tends to be excellent.

<Inorganic Filler (D)>

The interlayer insulating resin film of the present invention may further contain inorganic filler (D) to thereby lead an interlayer insulating layer to have a lower thermal expansion.

The addition amount in the case where the inorganic filler (D) is added varies according to characteristics and functions required for the interlayer insulating resin film of the present invention, but, for example, may range from 50 to 500 parts by mass, may range from 100 to 400 parts by mass, or may range from 150 to 300 parts by mass based on 100 parts by mass of resin components in the interlayer insulating resin film in terms of solid content.

The "resin components" mentioned herein mean the epoxy resin (A), the cyanate resin (B), the dicyandiamide (C), and other thermosetting resins and thermoplastic resins, which may be added as other components to be described below.

As the inorganic filler (D), silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate are exemplified. Among these, silica may be employed. These inorganic fillers may be used alone or in combination of two or more thereof.

Further, the average particle size of the inorganic filler (D) may be 5 μm or less. When the average particle size is 5 μm or less, at the time of formation of a circuit pattern on the interlayer insulating layer, formation of a fine pattern tends to be stably carried out. The average particle size is a particle diameter at a point corresponding to a volume 50% when a cumulative frequency distribution curve by a particle diameter is obtained based on a total of volumes of particles as 100%, and may be measured by a particle size distribution measuring device using a laser diffraction scattering method.

Further, the inorganic filler (D) may be subjected to a surface treatment with a surface treatment agent such as a silane coupling agent in order to improve moisture resistance.

The surface treatment agent is not particularly limited, but may be an aminosilane coupling agent, or a silicon oligomer coupling agent from the viewpoint of an inter-wiring filling property, and a flatness after lamination and thermosetting. That is, the inorganic filler (D) may be an inorganic filler subjected to a surface treatment using an aminosilane coupling agent, or an inorganic filler subjected to a surface treatment using a silicon oligomer coupling agent. Further, as the inorganic filler (D), an inorganic filler subjected to a surface treatment using an aminosilane coupling agent, and an inorganic filler subjected to a surface treatment using a silicon oligomer coupling agent may be used in combination, and the blending ratio may be a ratio at which the content of the inorganic filler subjected to a surface treatment using the aminosilane coupling agent ranges from 60 to 90 parts by mass, based on 100 parts by mass of the inorganic filler (D), or may be a ratio at which the content ranges from 70 to 80 parts by mass.

<Other Components>

Further, in the interlayer insulating resin film of the present invention, in addition to the above-described respective components, as necessary, other thermosetting resins and thermoplastic resins, and additives such as a flame retardant, an antioxidant, a flow adjusting agent, and a curing accelerator may be used, as long as the effect of the present invention is not impaired.

The interlayer insulating resin film of the present invention may have a support formed on any one surface thereof.

As the support, various plastic films such as films of polyolefin (e.g., polyethylene, polypropylene, polyvinyl chloride), films of polyester (e.g., polyethylene terephthalate (hereinafter, also referred to as "PET"), polyethylene naphthalate), a polycarbonate film, and a polyimide film are exemplified. A metal foil such as a release paper, a copper foil, or an aluminum foil may be used. The support and a protective film to be described below may be subjected to a surface treatment such as a mat treatment or a corona treatment. Further, a release treatment with a silicone resin releasing agent, an alkyd resin releasing agent, or a fluororesin releasing agent may be carried out. The thickness of the support is also not particularly limited, and may range from 10 μm to 150 μm, and may range from 25 μm to 50 μm.

The use of the interlayer insulating resin film of the present invention is not particularly limited, but uses for applications where the interlayer insulating layer is required, such as an adhesive film, an insulating resin sheet such as a prepreg, a circuit board, a solder resist, an underfill material, a die bonding material, a semiconductor sealing material, a hole filling resin, a part filling resin, may be made. Among these, a suitable use for forming the interlayer insulating layer in the production of a multilayer printed-wiring board may be made.

Next, descriptions will be made on a method of producing the interlayer insulating resin film of the present invention.

<Production Method of Interlayer Insulating Resin Film>

The interlayer insulating resin film of the present invention may be produced, for example, as follows.

When the interlayer insulating resin film is produced, first, an epoxy resin (A), a cyanate resin (B), a dicyandiamide (C) and other components to be used as necessary may be dissolved or dispersed in an organic solvent so as to provide a state of a resin varnish (hereinafter, also referred to as "a varnish for an interlayer insulating resin film").

The varnish for the interlayer insulating resin film may be produced by a method in which the epoxy resin (A), the cyanate resin (B), the dicyandiamide (C) and other components are blended with an organic solvent, and mixed by using a conventionally known mixer or the like.

As the organic solvent, for example, ketones such as acetone, methyl ethyl ketone, methyl isobutyl ketone, and cyclohexanone, acetic acid esters such as ethyl acetate, butyl acetate, cellosolve acetate, propylene glycol monomethyl ether acetate, and carbitol acetate, carbitols such as cellosolve and butyl carbitol, aromatic hydrocarbons such as toluene and xylene, and amide-based solvents such as dimethyl formamide, dimethyl acetamide, and N-methyl pyrrolidone are exemplified. These organic solvents may be used alone or in combination of two or more thereof.

The blending amount of the organic solvent may range from 10 to 50 parts by mass and may range from 10 to 35 parts by mass based on 100 parts by mass of varnish for the interlayer insulating resin film.

The varnish for the interlayer insulating resin film, which is produced in this manner, may be applied on a support, and heated and dried, so that the interlayer insulating resin film may be obtained.

The support is not particularly limited, and, for example, the same as the above-described support to be formed on the interlayer insulating resin film of the present invention is exemplified.

In a method of applying the varnish for the interlayer insulating resin film on the support, for example, a coating apparatus conventionally known to those skilled in the art such as a comma coater, a bar coater, a kiss coater, a roll coater, a gravure coater, or a die coater may be used. These coating apparatuses may be properly selected according to a film thickness.

A drying temperature and a drying time may be properly determined according to the use amount of the organic solvent, and the boiling point of the organic solvent to be used. Meanwhile, for example, in the case of the varnish for the interlayer insulating resin film, which contains 30% to 60% by mass of organic solvent, the interlayer insulating resin film may be suitably formed through drying at 50° C. to 150° C. for about 3 min to 10 min.

The content of a volatile component (mainly the organic solvent) in the interlayer insulating resin film of the present invention may be 10% by mass or less and may be 5% by mass or less.

The thickness of the interlayer insulating resin film of the present invention may be properly determined according to a required performance, but may be set to be equal to or greater than the thickness of a conductor layer of a circuit board on which the interlayer insulating resin film of the present invention is to be laminated. Specifically, since the thickness of the conductor layer included in the circuit board usually ranges from 5 μm to 70 μm, the thickness of the interlayer insulating resin film may range from 10 μm to 100 μm.

A protective film may be laminated on the surface of the interlayer insulating resin film formed on the support, which is the opposite side to the support. The thickness of the protective film is not particularly limited, but ranges from, for example, 1 μm to 40 μm. By laminating the protective film, it is possible to prevent adhesion of dust to the surface of the interlayer insulating resin film, and scratches. The interlayer insulating resin film may also be wound in a roll form and stored.

[Adhesion Auxiliary Layer-Attached Interlayer Insulating Resin Film]

In the adhesion auxiliary layer-attached interlayer insulating resin film of the present invention, an adhesion auxiliary layer is formed on one surface of the above-described interlayer insulating resin film of the present invention.

The adhesion auxiliary layer is located between an interlayer insulating layer formed by the interlayer insulating resin film of the present invention and a conductor layer formed by plating, and is formed for the purpose of improving adhesiveness to the conductor layer. By forming the adhesion auxiliary layer, a smooth surface is obtained, and a good adhesion strength to the conductor layer formed by plating is obtained, which thus is suitable from the viewpoint of forming fine wiring.

The adhesion auxiliary layer may be one capable of imparting good adhesiveness to the conductor layer formed by plating, and as an example thereof, one containing the epoxy resin (a), the cyanate resin (b), and the inorganic filler (c) is exemplified.

<Epoxy Resin (a)>

The epoxy resin (a) is not particularly limited, and the same as the above-described epoxy resin (A) is exemplified.

Among these, from the viewpoint of adhesiveness to a conductor layer, an alkylphenol novolac type epoxy resin is preferable, and from the viewpoint of lowering a thermal expansion coefficient of the interlayer insulating layer to be obtained, a naphthalene cresol novolac type epoxy resin is preferable.

The content of the epoxy resin (a) in the adhesion auxiliary layer is not particularly limited, but may range from 40 to 90 parts by mass, may range from 45 to 70 parts by mass, and may range from 50 to 60 parts by mass based on 100 parts by mass of solid content contained in the adhesion auxiliary layer. When the content of the epoxy resin (a) is 40 parts by mass or more, moisture resistance of a printed wiring board to be obtained, and adhesiveness between the conductor layer and the interlayer insulating layer tend to be excellent.

In the present specification, the solid content contained in the adhesion auxiliary layer means a residue obtained by removing a volatile component from components constituting the adhesion auxiliary layer.

<Cyanate Resin (b)>

The cyanate resin (b) is not particularly limited, and the same as the above-described cyanate resin (B) is exemplified, and with respect to the weight average molecular weight, the same as the above-described cyanate resin (B) is applicable.

The content of the cyanate resin (b) in the adhesion auxiliary layer is not particularly limited, but may range from 20 to 60 parts by mass, may range from 30 to 50 parts by mass, and may range from 35 to 45 parts by mass based on 100 parts by mass of solid content contained in the adhesion auxiliary layer. When the content of the cyanate resin (b) is 20 parts by mass or more based on 100 parts by mass of solid content contained in the adhesion auxiliary layer, a good dielectric property, a heat resistance, and a low thermal expansion property tend to be obtained. In the case of 60 parts by mass or less, adhesiveness to a conductor layer tends to be excellent after an accelerated environmental test.

<Inorganic Filler (c)>

By blending the inorganic filler (c) into the adhesion auxiliary layer, scattering of a resin may be prevented at the time of laser processing so that it is possible to adjust a laser processed shape of the interlayer insulating layer formed by the adhesion auxiliary layer-attached interlayer insulating resin film. Furthermore, when the surface of the interlayer insulating layer formed by the adhesion auxiliary layer-attached interlayer insulating resin film is roughened, a properly roughened surface may be formed so that it is possible to exhibit a good adhesion strength to a conductor layer formed by plating.

As the inorganic filler (c), the same as inorganic fillers exemplified as the above-described inorganic filler (D) is exemplified, and among these, silica may be employed. Further, as silica, fumed silica and colloidal silica are exemplified.

The specific surface area of the inorganic filler (c) may be 20 $m^2/g$ or more and may be 50 $m^2/g$ or more from the viewpoint of forming fine wiring on the interlayer insulating layer formed by the adhesion auxiliary layer. The upper limit of the specific surface area of the inorganic filler (c) is not particularly limited, but may be 500 $m^2/g$ or less, and may be 200 $m^2/g$ or less from the viewpoint of availability.

The specific surface area may be obtained through a BET method by low temperature/low humidity physical adsorption of inert gas. Specifically, molecules having a conventionally known adsorption occupation area may be adsorbed on the surfaces of powder particles at a liquid nitrogen temperature, and the specific surface area of the powder particles may be obtained from the adsorption amount.

As the inorganic filler (c) having a specific surface area of 20 $m^2/g$ or more, a commercial product may be used. Examples of the commercial product include AEROSIL R972 (manufactured by Nippon AEROSIL Co., Ltd., product name, specific surface area 110 $m^2/g$), and AEROSIL R202 (manufactured by Nippon AEROSIL Co., Ltd., product name, specific surface area 100 $m^2/g$), as fumed silica, and PL-1 (manufactured by FUSO Chemical Co., Ltd., product name, specific surface area 181 $m^2/g$), and PL-7 (manufactured by FUSO Chemical Co., Ltd., product name, specific surface area 36 $m^2/g$) as colloidal silica. Further, from the viewpoint of improving moisture resistance, an inorganic filler subjected to a surface treatment with a surface treatment agent such as a silane coupling agent may be employed.

The content of the inorganic filler (c) in the adhesion auxiliary layer may range from 3 to 30 parts by mass, may range from 3 to 25 parts by mass, and may range from 5 to 20 parts by mass based on 100 parts by mass of resin components in the adhesion auxiliary layer in terms of solid content. When the content of the inorganic filler (c) is 3 parts by mass or more based on 100 parts by mass of resin components in the adhesion auxiliary layer in terms of solid content, a good laser processability tends to be obtained. Meanwhile, in the case of 30 parts by mass or less, a sufficient adhesive strength between the adhesion auxiliary layer and the conductor layer tends to be obtained when the conductor layer is formed by plating after the interlayer insulating layer is roughened.

<Other Components>

In the adhesion auxiliary layer, in addition to the above-described respective components, as necessary, other thermosetting resins and thermoplastic resins, and additives such as a flame retardant, an antioxidant, a flow adjusting agent, and a curing accelerator may be used as long as the effect of the present invention is not impaired.

The adhesion auxiliary layer-attached interlayer insulating resin film may further have a support formed on the surface of the adhesion auxiliary layer opposite to the surface on which the interlayer insulating resin film is formed.

As the support, the same as the above-described support used in the production method of the interlayer insulating resin film of the present invention is exemplified.

<Production Method of Adhesion Auxiliary Layer-Attached Interlayer Insulating Resin Film>

The adhesion auxiliary layer-attached interlayer insulating resin film of the present invention may be produced by, for example, a method of forming an adhesion auxiliary layer on the support, and forming an interlayer insulating resin film thereon.

When the adhesion auxiliary layer is formed, an epoxy resin (a), a cyanate resin (b), inorganic filler (c), and other components may be dissolved or dispersed in an organic solvent so as to provide a state of a resin varnish (hereinafter, also referred to as "a varnish for an adhesion auxiliary layer").

The production method of the varnish for the adhesion auxiliary layer, and the organic solvent used for producing the varnish for the adhesion auxiliary layer are the same as those for the above-described varnish for the interlayer insulating resin film.

The blending amount of the organic solvent may range from 60 to 95 parts by mass, and may range from 70 to 90 parts by mass based on 100 parts by mass of varnish for the adhesion auxiliary layer.

The varnish for the adhesion auxiliary layer, which is produced in this manner, is applied on the support, and heated and dried, and further the above-described varnish for the interlayer insulating resin film is applied thereon, and heated and dried, thereby forming an adhesion auxiliary layer-attached interlayer insulating resin film.

An applying method of the varnish for the adhesion auxiliary layer or the varnish for the interlayer insulating resin film, and a drying condition after applying of these are the same as the applying method and the drying condition in the production method of the interlayer insulating resin film of the present invention.

The thickness of the interlayer insulating resin film formed in the adhesion auxiliary layer-attached interlayer insulating resin film of the present invention may be properly determined according to a required performance, but may be set to be equal to or greater than the thickness of a conductor layer of a circuit board on which the interlayer insulating resin film is to be laminated. Specifically, since the thickness of the conductor layer included in the circuit board usually ranges from 5 μm to 70 μm, the thickness of the interlayer insulating resin film may range from 10 μm to 100 μm. Further, the thickness of the adhesion auxiliary layer is also not particularly limited, and, for example, may range from 1 μm to 15 μm.

A protective film may be further laminated on the surface of the adhesion auxiliary layer-attached interlayer insulating resin film, on which the adhesion auxiliary layer is not formed. The thickness of the protective film is not particularly limited, but, ranges from, for example, 1 μm to 40 μm. By laminating the protective film, it is possible to prevent adhesion of dust to the surface of the interlayer insulating resin film and scratches. The interlayer insulating resin film may also be wound in a roll form and stored.

[Printed Wiring Board]

The printed wiring board of the present invention is obtained by using the interlayer insulating resin film, or the adhesion auxiliary layer-attached interlayer insulating resin film of the present invention.

Hereinafter, descriptions will be made on a method of producing the printed wiring board by laminating the interlayer insulating resin film or the adhesion auxiliary layer-attached interlayer insulating resin film of the present invention on a circuit board.

The printed wiring board may be produced by a production method including steps as the following steps (1) to (5), in which a support may be peeled off or removed after a step (1), a step (2) or a step (3).

Step (1): a step of laminating the interlayer insulating resin film or the adhesion auxiliary layer-attached interlayer insulating resin film of the present invention, on one surface or both surfaces of a circuit board.

Step (2): a step of thermally curing the laminated interlayer insulating resin film or the adhesion auxiliary layer-attached interlayer insulating resin film to form an interlayer insulating layer.

Step (3): a step of drilling the circuit board on which the interlayer insulating layer is formed.

Step (4): a step of performing a roughening treatment on the surface of the interlayer insulating layer.

Step (5): a step of forming a conductor layer by plating on the roughened surface of the interlayer insulating layer.

<Step (1)>

The step (1) is a step of laminating the interlayer insulating resin film or the adhesion auxiliary layer-attached interlayer insulating resin film of the present invention, on one surface or both surfaces of a circuit board. As a device of laminating the interlayer insulating resin film or the adhesion auxiliary layer-attached interlayer insulating resin film, a vacuum laminator is suitable. As the vacuum laminator, a commercial product may be used, and examples of the vacuum laminator as the commercial product include a vacuum applicator manufactured by Nichigo•Morton Co., Ltd., a vacuum pressure-type laminator of Meiki Co., Ltd., a roll-type dry coater manufactured by Hitachi Industries Co., Ltd., and a vacuum laminator manufactured by Hitachi AIC Inc.

In the lamination, when the interlayer insulating resin film or the adhesion auxiliary layer-attached interlayer insulating resin film has a protective film, after the protective film is removed, the interlayer insulating resin film or the adhesion auxiliary layer-attached interlayer insulating resin film is press-bonded on a circuit board while being pressurized and heated.

When the adhesion auxiliary layer-attached interlayer insulating resin film is used, the surface of the interlayer insulating resin film, on which the adhesion auxiliary layer is not formed, is arranged to face the surface of the circuit board on which a circuit is formed.

A lamination condition is not particularly limited, and the interlayer insulating resin film or the adhesion auxiliary layer-attached interlayer insulating resin film, and the circuit board may be pre-heated as necessary, and lamination may be carried out at a press-bonding temperature (lamination temperature) of 60° C. to 140° C., a press-bonding pressure of 0.1 MPa to 1.1 MPa ($9.8 \times 10^4$ to $107.9 \times 10^4$ N/m²), and under reduced pressure of 20 mmHg (26.7 hPa) or less in air pressure. Further, a lamination method may be a batch-type, or may be a continuous-type with a roll.

<Step (2)>

The step (2) is a step of thermally curing the interlayer insulating resin film or the adhesion auxiliary layer-attached interlayer insulating resin film laminated in the step (1) to form an interlayer insulating layer. In this step, first, the circuit board on which the interlayer insulating resin film or the adhesion auxiliary layer-attached interlayer insulating resin film is laminated in the step (1) is cooled to around room temperature.

Subsequently, when a support is peeled off, after peeling-off, the interlayer insulating resin film or the adhesion auxiliary layer-attached interlayer insulating resin film laminated on the circuit board is heat-cured to form an interlayer insulating layer. The condition for heat-curing is not particularly limited, and for example, may be selected in a range of 170° C. to 220° C. and 20 to 150 min. When a support subjected to a release treatment is used, the support may be peeled off after thermosetting is performed.

When the printed wiring board is produced by using the adhesion auxiliary layer-attached interlayer insulating resin film, a cured product of the adhesion auxiliary layer and the interlayer insulating resin film corresponds to the interlayer insulating layer.

<Step (3)>

The step (3) is a step of drilling the circuit board on which the interlayer insulating layer is formed. In this step, drilling is performed on the interlayer insulating layer and the circuit board formed in the step (2) by a method such as drilling, laser, plasma, or a combination thereof, to form a via hole or a through hole. As the laser, $CO_2$ gas laser, YAG laser, UV laser, or excimer laser is generally used.

<Step (4)>

The step (4) is a step of performing a roughening treatment on the surface of the interlayer insulating layer. In this step, the surface of the interlayer insulating layer formed in the step (2) is subjected to a roughening treatment by an oxidant. At the same time, when a via hole or a through hole is formed, it is also possible to remove "smears" occurring at the time of formation of these.

The oxidant is not particularly limited, and, examples thereof include permanganate (potassium permanganate, sodium permanganate), dichromate, ozone, hydrogen peroxide, sulfuric acid, and nitric acid. Among these, the roughening, and the removal of smears may be performed by using an alkaline permanganate solution (for example, a solution of potassium permanganate, sodium permanganate) that is an oxidant commonly used for roughening of the interlayer insulating layer in the production of the printed wiring board by a build-up method.

<Step (5)>

The step (5) is a step of forming a conductor layer by plating on the roughened surface of the interlayer insulating layer. In this step, a semi-additive method may be used in which a power feeding layer is formed on the surface of the interlayer insulating layer by electroless plating, and then a plating resist having a pattern reverse to the conductor layer is formed, and the conductor layer (circuit) is formed by electrolytic plating. After the conductor layer is formed, for example, by performing an annealing treatment at 150° C. to 200° C. for 20 to 90 min, it is possible to further improve and stabilize an adhesion strength between the interlayer insulating layer and the conductor layer.

A step of roughening the surface of the conductor layer produced in this manner may be further included. The roughening of the surface of the conductor layer has an effect of increasing the adhesiveness to a resin in contact with the conductor layer. In order to roughen the conductor layer, MECetchBOND CZ-8100, MECetchBOND CZ-8101, and MECetchBOND CZ-5480 (which are manufactured by MEC Co., Ltd., product names), as organic acid-based microetching agents, may be used.

EXAMPLES

[a] Hereinafter, the first invention will be described in more detail by Examples, but the first invention is not limited by these examples at all.

Example 1

A resin composition varnish 1 for an adhesive film was prepared by blending and mixing:

as an epoxy resin, 25.8 parts by mass of biphenyl novolac type epoxy resin "NC-3000-H" (manufactured by Nippon Kayaku Co., Ltd., product name, solid content concentration 100% by mass);

as a novolac type phenolic resin, 6.3 parts by mass of "PAPS-PN2" (manufactured by Asahi Yukizai Corporation, product name, solid content concentration 100% by mass, Mw/Mn=1.17);

as an epoxy resin curing agent, 4.9 parts by mass of triazine modified phenol novolac resin "LA-1356-60 M" (manufactured by DIC corporation, product name, solvent: MEK, solid content concentration 60% by mass);

as inorganic filler, 92.9 parts by mass of silica (solid content concentration 70% by mass) in which the surface of "SO-C2" (manufactured by Admatechs Co., Ltd., product name, average particle size; 0.5 μm) is treated with an aminosilane coupling agent and then, dispersed in MEK;

as a curing accelerator, 0.026 parts by mass of 2-ethyl-4-methylimidazole "2E4MZ" (manufactured by Shikoku Chemicals Corporation, product name, solid content concentration 100% by mass); and as an additive solvent, 13.1 parts by mass of MEK, and subjecting the resultant to a bead-mill dispersing treatment.

The resin composition varnish 1 for the adhesive film obtained above was applied on PET (manufactured by Teijin DuPont film Co., Ltd., product name: G2, film thickness: 50 μm) as a support film and then dried to form a resin composition layer. The coating thickness was 40 μm, and the drying was performed such that 8.0% by mass of residual solvent was included in the resin composition layer. After the drying, as a protective film, a polyethylene film (manufactured by Tamapoly Co., Ltd., product name: NF-13, thickness: 25 μm) was laminated on the resin composition layer surface side. Then, the obtained film was wound in a roll form to obtain an adhesive film 1.

Examples 2 to 6 and 8, Comparative Examples 1 to 4

Adhesive films 2 to 6, and 8 to 12 were obtained in the same manner as in Example 1 except that a raw material composition and production conditions in Example 1 were changed as shown in Table 1.

Example 7

A support film 2 having a thickness of 60 μm was obtained by applying a resin varnish A produced by the following procedure on PET (manufactured by Teijin DuPont film Co., Ltd, product name: G2, film thickness: 50 μm) as a support film, followed by drying, so as to provide a film thickness of 10 μm.

The resin varnish A used as described above was prepared by the following procedure.

The resin varnish A was prepared by blending and mixing:

as an epoxy resin, 63.9 parts by mass of biphenyl novolac type epoxy resin "NC-3000-H" (manufactured by Nippon Kayaku Co., Ltd., product name, solid content concentration 100% by mass);

as an epoxy resin curing agent, 18.0 parts by mass of triazine modified phenol novolac resin "LA-1356-60M" (manufactured by DIC corporation, product name, solvent; MEK, solid content concentration 60% by mass);

as core-shell rubber particles, 15.2 parts by mass of "EXL-2655" (manufactured by Rohm and Haas Electronic Materials Co., Ltd., product name);

as inorganic filler, 8.8 parts by mass of "AEROSIL R972" (manufactured by Nippon AEROSIL Co., Ltd., product name, average particle size; 0.02 μm, solid content concentration 100% by mass) which is a fumed silica;

as a curing accelerator, 1.28 parts by mass of 2-ethyl-4-methylimidazole "2E4MZ" (manufactured by Shikoku Chemicals Corporation, product name, solid content concentration 100% by mass); and as an additive solvent, 226.1 parts by mass of cyclohexanone, and subjecting the resultant to a bead-mill dispersing treatment.

The resin varnish A obtained above was applied to have a film thickness of 10 μm on PET (manufactured by Teijin DuPont film Co., Ltd, product name: G2, film thickness: 50 μm) as a support film, and then dried so that the support film 2 with a film thickness of 60 μm was obtained.

Next, a resin composition varnish for an adhesive film to be applied on the support film 2 obtained above was produced in the same manner as in Example 1 by the raw material composition and production conditions shown in Table 1.

An adhesive film 7 was obtained in the same manner as in Example 1 by using the support film 2, and the resin composition varnish for the adhesive film.

[Evaluation Method]

The obtained adhesive films 1 to 12 were evaluated by the following method.

(Preparation of Test Sample for Handling Property Test of Adhesive Film and Test Method)

The obtained adhesive films 1 to 12 were cut into a size of 500 mm×500 mm to prepare test samples 1 to 12 for a handling property test of an adhesive film.

By using the prepared test samples 1 to 12 for the handling property test of the adhesive film, the handling property was evaluated by the following methods (1) to (3). One which was defective in any one of tests was regarded as "defective in handling property," and one which was not defective in any of tests was regarded as "good in handling property."

(1) For the test samples 1 to 12 for the handling property test of the adhesive film, first, a protective film was peeled off. When the protective film was peeled off, one in which a part of an applied and dried resin adhered to the protective film side, or powder falling occurred was regarded as defective in handling property.

(2) One having two points at the center end of the film (to have 500 mm×250 mm, two points at the end portion) in which cracking occurred in the applied and dried resin was regarded as defective in handling property.

(3) Lamination was performed on a copper-clad laminate plate "MCL-E-679FG(R)" (manufactured by Hitachi Chemical Co., Ltd., copper foil thickness 12 μm, plate thickness 0.41 mm), which was obtained by performing blackening and reduction treatments on the surface copper foil, through laminating by using a batch-type vacuum pressure-type laminator "MVL-500" (manufactured by Meiki Co., Ltd., product name). Here, settings were made such that a vacuum degree was 30 mmHg or less, the temperature was 90° C., and the pressure was 0.5 MPa. After cooling to room temperature, a support film was peeled off (for the adhesive film 7, in the support film 2, peeling occurred between PET and a resin layer formed thereon). Here, a material in which powder falling occurred or PET was ripped halfway was regarded as defective in handling property.

(Preparation of Test Sample for Thermal Expansion Coefficient Measurement and Test Method)

Each of the obtained adhesive films 1 to 12 was cut into a size of 200 mm×200 mm, and then, laminated on a copper foil having a thickness of 18 μm through laminating by using a batch-type vacuum pressure-type laminator "MVL-500" (manufactured by Meiki Co., Ltd., product name) after a protective film was peeled off. Here, settings were made such that a vacuum degree was 30 mmHg or less, the temperature was 90° C., and the pressure was 0.5 MPa.

After cooling to room temperature, a support film was peeled off (for the adhesive film 7, in the support film 2, peeling occurred between PET and a resin layer formed thereon), and curing was performed in a dryer at 180° C. for 120 min. Thereafter, the copper foil was removed with a ferric chloride solution, and then cutting-out with a width 3 mm and a length 8 mm was performed to obtain test samples 1 to 12 for thermal expansion coefficient measurement.

By using the prepared test samples 1 to 12 for the thermal expansion coefficient measurement, a thermal expansion coefficient was measured by the following method.

When the obtained test samples 1 to 12 for the thermal expansion coefficient measurement were heated to 240° C. at a heating rate of 10° C./min, cooled to −10° C., and heated to 300° C. at a heating rate of 10° C./min, by using a thermomechanical analyzing device manufactured by Seiko Instruments Inc., a change curve of an expansion amount was obtained and an average thermal expansion coefficient at 0° C. to 150° C. in the corresponding expansion amount change curve was obtained.

(Preparation of Filling Property Evaluation Board and Test Method)

An inner layer circuit used for a filling property evaluation board was as follows. On a copper-clad laminate plate "MCL-E-679FG(R)" (manufactured by Hitachi Chemical Co., Ltd., product name) with a copper foil thickness of 12 μm and a plate thickness of 0.15 mm (including the copper foil thickness), a group of 25×25 through holes with a diameter of 0.15 mm were prepared at intervals of 5 mm by a drilling method. Subsequently, desmearing and electroless plating were carried out, and electrolytic plating was used to perform electrolytic plating in the through holes.

As a result, a circuit board was obtained in which a plate thickness including a copper thickness was 0.2 mm, and 25×25 through holes with a diameter of 0.1 mm are included at intervals of 5 mm.

Next, the adhesive films 1 to 12 after a protective film was peeled off were arranged such that a resin composition layer faced a circuit surface side of the circuit board, and then, were laminated through laminating by using a batch-type vacuum laminator "MVL-500" (manufactured by Meiki Co., Ltd., product name).

Here, settings were made such that a vacuum degree was 30 mmHg, the temperature was 90° C., and the pressure was 0.5 MPa.

After cooling to room temperature, the circuit board having through holes attached with adhesive films on both sides was interposed between two 1 mm thickness aluminum plates, and was laminated by using the above-described vacuum laminator. Here, settings were made such that a vacuum degree was 30 mmHg, the temperature was 90° C., and the pressure was 0.7 MPa.

After cooling to room temperature, a support film was peeled off (for the adhesive film 7, in the support film 2, peeling occurred between PET and a resin layer formed thereon), and curing was performed in a dryer at 180° C. for 120 min. In this manner, filling property evaluation boards 1 to 12 were obtained.

By using the prepared filling property evaluation boards 1 to 12, a filling property was evaluated by the following method.

By using a contact-type surface roughness meter "SV2100" (product name) manufactured by Mitutoyo Corporation, a level difference was measured on the surface in the through hole portion in the filling property evaluation boards 1 to 12. The level difference was measured such that 10 central portions of the through hole surfaces were included, and an average value of 10 recessed portions was calculated.

TABLE 1

Blending Table and Material adhesive Film

|  |  | Concentration (%) | Blending amount | Example 1 | Example 2 | Example 3 | Example 4 | Example 5 | Example 6 | Example 7 |
|---|---|---|---|---|---|---|---|---|---|---|
| Epoxy resin | NC-3000-H | 100 | part by mass | 25.8 | 25.8 | 25.8 | 25.8 | 18.4 | 33.2 | 25.8 |
|  |  |  | solid content part by mass | 25.8 | 25.8 | 25.8 | 25.8 | 18.4 | 33.2 | 25.8 |
|  | N673-80M | 80 | part by mass | 0.0 | 0.0 | 0.0 | 0.0 | 0.0 | 0.0 | 0.0 |
|  |  |  | solid content part by mass | 0.0 | 0.0 | 0.0 | 0.0 | 0.0 | 0.0 | 0.0 |
| Novolac type phenol resin | PAPS-PN2 | 100 | part by mass | 6.3 | 0.0 | 6.3 | 6.3 | 4.5 | 8.0 | 6.3 |
|  |  |  | solid content part by mass | 6.3 | 0.0 | 6.3 | 6.3 | 4.5 | 8.0 | 6.3 |
|  | PAPS-PN3 | 100 | part by mass | 0.0 | 6.3 | 0.0 | 0.0 | 0.0 | 0.0 | 0.0 |
|  |  |  | solid content part by mass | 0.0 | 6.3 | 0.0 | 0.0 | 0.0 | 0.0 | 0.0 |
|  | HP-850 | 100 | part by mass | 0.0 | 0.0 | 0.0 | 0.0 | 0.0 | 0.0 | 0.0 |
|  |  |  | solid content part by mass | 0.0 | 0.0 | 0.0 | 0.0 | 0.0 | 0.0 | 0.0 |

TABLE 1-continued

| | | | | | | | | | | |
|---|---|---|---|---|---|---|---|---|---|---|
| Triazine-modified novolac resin | LA-1356-60M | 60 | part by mass<br>solid content part by mass | 4.9<br>2.9 | 4.8<br>2.9 | 4.9<br>2.9 | 4.9<br>2.9 | 3.5<br>2.1 | 6.2<br>3.7 | 4.9<br>2.9 |
| Inorganic filler | SO-C2<br>(Average particle size: 0.5 μm) | 70 | part by mass<br>solid content part by mass | 92.9<br>65.0 | 92.9<br>65.0 | 0.0<br>0.0 | 92.9<br>65.0 | 107.1<br>75.0 | 78.6<br>55.0 | 92.9<br>65.0 |
| | SO-C2<br>(Average particle size: 2.2 μm) | 70 | part by mass<br>solid content part by mass | 0.0<br>0.0 | 0.0<br>0.0 | 92.9<br>65.0 | 0.0<br>0.0 | 0.0<br>0.0 | 0.0<br>0.0 | 0.0<br>0.0 |
| | Aerosil R972<br>(Average particle size: 0.02 μm) | 40 | part by mass<br>solid content part by mass | 0.0<br>0.0 | 0.0<br>0.0 | 0.0<br>0.0 | 0.0<br>0.0 | 0.0<br>0.0 | 0.0<br>0.0 | 0.0<br>0.0 |
| Curing accelerator | 2E4MZ | 100 | part by mass<br>solid content part by mass | 0.026<br>0.026 | 0.026<br>0.026 | 0.026<br>0.026 | 0.026<br>0.026 | 0.018<br>0.018 | 0.033<br>0.033 | 0.026<br>0.026 |
| Additional solvent | MEK | — | part by mass | 13.1 | 13.1 | 13.1 | 13.1 | 9.3 | 16.8 | 13.1 |
| Solid content concentration | — | — | mass % | 77.0 | 77.0 | 77.0 | 77.0 | 74.9 | 79.3 | 77.0 |
| Content of inorganic filler in resin solid content | — | — | mass % | 65.0 | 65.0 | 65.0 | 65.0 | 75.0 | 55.0 | 65.0 |
| Average particle size of inorganic filler | — | — | μm | 0.5 | 0.5 | 2.2 | 0.5 | 0.5 | 0.5 | 0.5 |
| Support film thickness | — | — | μm | 50 | 50 | 50 | 38 | 50 | 50 | 60 |
| Residual solvent amount | — | — | mass(wt) % | 8.0 | 8.0 | 8.0 | 8.0 | 8.0 | 8.0 | 9.0 |

Evaluation Results

| Evaluation item | Evaluation method | Target | Unit (notation) | Example 1 | Example 2 | Example 3 | Example 4 | Example 5 | Example 6 | Example 7 |
|---|---|---|---|---|---|---|---|---|---|---|
| Handling property of adhesive film | Handling property | Good | Good · poor | Good | Good | Good | Good | Good | Good | Good |
| Thermal expansion coefficient | TMA | <40 | ppm/° C. | 28 | 28 | 28 | 28 | 24 | 35 | 30 |
| Filling property by lamination | Level difference | <2.5 | μm | 1.8 | 2.1 | 0.9 | 1.8 | 2.3 | 1.2 | 2.0 |

Blending Table and Material adhesive Film

| | | Concentration (%) | Blending amount | Example 8 | Comparative Example 1 | Comparative Example 2 | Comparative Example 3 | Comparative Example 4 |
|---|---|---|---|---|---|---|---|---|
| Epoxy resin | NC-3000-H | 100 | part by mass<br>solid content part by mass | 25.8<br>25.8 | 25.8<br>25.8 | 25.8<br>25.8 | 66.4<br>66.4 | 1.5<br>1.5 |
| | N673-80M | 80 | part by mass<br>solid content part by mass | 0.0<br>0.0 | 0.0<br>0.0 | 0.0<br>0.0 | 0.0<br>0.0 | 0.0<br>0.0 |
| Novolac type phenol resin | PAPS-PN2 | 100 | part by mass<br>solid content part by mass | 6.3<br>6.3 | 0.0<br>0.0 | 6.3<br>6.3 | 16.1<br>16.1 | 0.4<br>0.4 |
| | PAPS-PN3 | 100 | part by mass<br>solid content part by mass | 0.0<br>0.0 | 0.0<br>0.0 | 0.0<br>0.0 | 0.0<br>0.0 | 0.0<br>0.0 |
| | HP-850 | 100 | part by mass<br>solid content part by mass | 0.0<br>0.0 | 6.3<br>6.3 | 0.0<br>0.0 | 0.0<br>0.0 | 0.0<br>0.0 |
| Triazine-modified novolac resin | LA-1356-60M | 60 | part by mass<br>solid content part by mass | 4.9<br>2.9 | 4.9<br>2.9 | 4.9<br>2.9 | 12.5<br>7.5 | 0.3<br>0.2 |
| Inorganic filler | SO-C2<br>(Average particle size: 0.5 μm) | 70 | part by mass<br>solid content part by mass | 92.9<br>65.0 | 92.9<br>65.0 | 0.0<br>0.0 | 14.3<br>10.0 | 140.0<br>98.0 |
| | SO-C2<br>(Average particle size: 2.2 μm) | 70 | part by mass<br>solid content part by mass | 0.0<br>0.0 | 0.0<br>0.0 | 0.0<br>0.0 | 0.0<br>0.0 | 0.0<br>0.0 |
| | Aerosil R972<br>(Average particle size: 0.02 μm) | 40 | part by mass<br>solid content part by mass | 0.0<br>0.0 | 0.0<br>0.0 | 162.5<br>65.0 | 0.0<br>0.0 | 0.0<br>0.0 |
| Curing accelerator | 2E4MZ | 100 | part by mass<br>solid content part by mass | 0.026<br>0.026 | 0.026<br>0.026 | 0.026<br>0.026 | 0.066<br>0.066 | 0.001<br>0.001 |
| Additional solvent | MEK | — | part by mass | 13.1 | 16.8 | 56.6 | 33.6 | 0.7 |
| Solid content concentration | — | — | mass % | 77.0 | 77.0 | 50.1 | 91.5 | 70.4 |
| Content of inorganic filler in resin solid content | — | — | mass % | 65.0 | 65.0 | 65.0 | 10.0 | 98.0 |

TABLE 1-continued

| | | | | Example 8 | Comparative Example 1 | Comparative Example 2 | Comparative Example 3 | Comparative Example 4 |
|---|---|---|---|---|---|---|---|---|
| Average particle size of inorganic filler | — | μm | | 0.5 | 0.5 | 0.02 | 0.5 | 0.5 |
| Support film thickness | — | μm | | 9 | 50 | 50 | 50 | 50 |
| Residual solvent amount | — | mass(wt) % | | 8.0 | 8.0 | 17.0 | 6.0 | 15.0 |

Evaluation Results

| Evaluation item | Evaluation method | Target | Unit (notation) | Example 8 | Comparative Example 1 | Comparative Example 2 | Comparative Example 3 | Comparative Example 4 |
|---|---|---|---|---|---|---|---|---|
| Handling property of adhesive film | Handling property | Good | Good · poor | Good | Good | Poor | Good | Poor |
| Thermal expansion coefficient | TMA | <40 | ppm/° C. | 27 | 28 | 27 | 52 | 9 |
| Filling property by lamination | Level difference | <2.5 | μm | 1.8 | 3.1 | 7.2 | 0.6 | 6.9 |

Components in Table 1 will be described below.
[Epoxy Resin]
NC-3000-H: biphenyl novolac type epoxy resin (manufactured by Nippon Kayaku Co., Ltd., product name, solid content concentration 100% by mass)
N-673-80M: cresol novolac type epoxy resin (manufactured by DIC corporation, product name, solvent; MEK, solid content concentration 80% by mass)
[Novolac Type Phenolic Resin]
PAPS-PN2: novolac type phenolic resin (manufactured by Asahi Yukizai Corporation, product name, solid content concentration 100% by mass, Mw/Mn=1.17)
PAPS-PN3: novolac type phenolic resin (manufactured by Asahi Yukizai Corporation, product name, solid content concentration 100% by mass, Mw/Mn=1.50)
HP-850: novolac type phenolic resin prepared by using hydrochloric acid instead of phosphoric acid (manufactured by Hitachi Chemical Co., Ltd., product name, solid content concentration 100% by mass)
[Triazine-Modified Phenol Novolac Resin]
LA-1356-60M: triazine-modified phenol novolac resin (manufactured by DIC corporation, product name, solvent; MEK, solid content concentration 60% by mass)
[Inorganic Filler]
SO-C2: silica (solid content concentration 70% by mass) in which the surface of silica "SO-C2" (product name, average particle size; 0.5 μm) manufactured by Admatechs Co., Ltd. was treated with an aminosilane coupling agent, and further, dispersed in an MEK solvent
SO-C6: silica (solid content concentration 70% by mass) in which the surface of silica "SO-C6" (product name, average particle size; 2.2 μm) manufactured by Admatechs Co., Ltd. was treated with an aminosilane coupling agent, and further, dispersed in an MEK solvent
AEROSIL R972: fumed silica (manufactured by Nippon AEROSIL Co., Ltd., product name, solid content concentration 100% by mass, specific surface area: 100 m²/g)
[Curing Accelerator]
2E4MZ: 2-ethyl-4-methylimidazole (manufactured by Shikoku Chemicals Corporation, product name, solid content concentration 100% by mass)

From Table 1, it can be found that the adhesive film of the present invention is good in a handling property, and from the adhesive film of the present invention, an interlayer insulating layer having a low thermal expansion coefficient, and an excellent filling property is obtained.

Meanwhile, when the adhesive film of the present invention is not used, any of a handling property, a thermal expansion coefficient, and a filling property is inferior.

That is, it can be found that according to the first invention, it is possible to provide an adhesive film having a low thermal expansion coefficient, an excellent filling property, and an excellent handling property, and to provide an interlayer insulating layer having a low thermal expansion coefficient after curing.

[b] Hereinafter, the second invention will be described in more detail but the present invention is not limited by these Examples.

The weight average molecular weight of a cyanate prepolymer was obtained through conversion from a calibration curve using standard polystyrene by gel permeation chromatography (GPC). The calibration curve was approximated by a cubic equation by using standard polystyrene: TSKgel (SuperHZ2000, SuperHZ3000 [manufactured by Tosoh Corporation]). Conditions for GPC are described below.

Device: Pump: 880-PU [manufactured by JASCO Corporation]
RI detector: 830-RI [manufactured by JASCO Corporation]
Thermostatic chamber: 860-CO [manufactured by JASCO Corporation]
Autosampler: AS-8020 [manufactured by Tosoh Corporation]
Eluent: tetrahydrofuran
Test sample concentration: 30 mg/5 mL
Injection volume: 20 μL
Flow rate: 1.00 mL/min
Measurement temperature: 40° C.

[Synthesis of Prepolymer of Bisphenol A Dicyanate (Cyanate Prepolymer)]

Production Example 1

Into a 1L-volume separable flask, 269.6 g of toluene, 620.4 g of 2,2-bis(4-cyanatophenyl)propane (manufactured by LONZA Japan Co., Ltd., product name: Primaset BADCY), and 9.5 g of p-(α-cumyl)phenol (manufactured by Tokyo Chemical Industry Co., Ltd) were charged. After it was visually confirmed that 2,2-bis(4-cyanatophenyl)propane and p-(α-cumyl)phenol were dissolved in toluene, while the solution temperature was kept at 100° C., 0.46 g of zinc naphthenate (manufactured by Wako Pure Chemical Corporation), which was diluted with toluene to 10% by mass in advance, was blended as a reaction accelerator, and a reaction was performed at 100° C. for 3 hours to thereby obtain a prepolymer solution of bisphenol A dicyanate (weight average molecular weight: 1,000, solid content concentration about 70% by mass).

[Production of Interlayer Insulating Resin Film]

Example 1

As the inorganic filler (D), 51.2 parts by mass (solid content) of silica filler (manufactured by Admatechs Co., Ltd., product name: SC-2050-KNK, methyl isobutyl ketone dispersion with solid content concentration of 70% by mass) subjected to an aminosilane coupling agent treatment, and 17.1 parts by mass (solid content) of silica filler (manufactured by Admatechs Co., Ltd., product name: SC-2050-KC, methyl isobutyl ketone dispersion with solid content concentration of 70% by mass) subjected to a silicon oligomer coupling agent (manufactured by Hitachi Chemical Co., Ltd., product name: SC6000) treatment were mixed.

The resultant was mixed with 1.6 parts by mass (solid content) of phenoxy resin (manufactured by Mitsubishi Chemical Corporation, product name: YL7213B, methyl ethyl ketone solution with solid content concentration of 35% by mass), 0.015 parts by mass (solid content) of dicyandiamide (manufactured by Kanto Chemical Co., Inc., propylene glycol monomethyl ether solution with solid content concentration of 0.8% by mass), 8.4 parts by mass (solid content) of prepolymer solution of the bisphenol A dicyanate obtained in Production Example 1, 1.0 parts by mass of p-(α-cumyl)phenol (paracumylphenol) (manufactured by Tokyo Chemical Industry Co., Ltd, molecular weight 212), 8.4 parts by mass of naphthalene type epoxy resin (manufactured by Nippon Kayaku Co., Ltd., product name: NC-7000L, epoxy equivalent 231), and 10.5 parts by mass of aralkyl type epoxy resin (manufactured by Nippon Kayaku Co., Ltd., product name: NC-3000H, epoxy equivalent 289) in this order, and dissolution was performed at room temperature by a high-speed rotation mixer.

After dissolution, as a flame retardant, 1.7 parts by mass of 1,3-phenylenebis(di-2,6-xylenylphosphate) (manufactured by Daihachi Chemical Industry Co., Ltd., product name: PX-200), as an antioxidant, 0.08 parts by mass of 4,4'-butylidenebis-(6-t-butyl-3-methylphenol) (manufactured by Mitsubishi Chemical Corporation, product name: YOSHINOX BB), as a flow adjusting agent, 0.08 parts by mass (solid content) of "BYK310" (manufactured by BYG Chemi Japan Co., Ltd., product name, xylene solution with solid content concentration of 25% by mass), as an organic curing accelerator, 0.02 parts by mass of 1-cyanoethyl-2-phenylimidazole (manufactured by Shikoku Chemicals Corporation, product name: 2PZ-CN), and as a metallic curing accelerator, 0.002 parts by mass of zinc naphthenate (manufactured by Wako Pure Chemical Corporation) were blended therein, and were stirred at room temperature until these were dissolved. Thereafter, through dispersion by a nanomizer treatment, a varnish 1 to be used for producing an interlayer insulating resin film was obtained.

Next, the varnish 1 was applied on a PET film (thickness 38 μm) as a support by using a comma coater such that the resulting dried interlayer insulating resin film had a thickness of 37 μm, and then dried at 105° C. for 2 min. The amount of a volatile component in the dried interlayer insulating resin film was 6% by mass. Subsequently, the interlayer insulating resin film was wound in a roll form while a polypropylene film having a thickness of 15 μm as a protective film was stuck to the surface thereof, and thus, the interlayer insulating resin film having the support and the protective film was obtained.

Examples 2 to 5, Comparative Example 1

Varnishes 2 to 6 to be used for producing interlayer insulating resin films were obtained in the same manner as in Example 1 except that the blending amount of dicyandiamide (manufactured by Kanto Chemical Co., Inc., propylene glycol monomethyl ether solution with solid content concentration of 0.8% by mass) in Example 1 was changed to a blending amount shown in Table 2. Next, by using these varnishes 2 to 6, the respective interlayer insulating resin films having a support and a protective film were obtained in the same manner as in Example 1.

[Production of Adhesion Auxiliary Layer-Attached Interlayer Insulating Resin Film]

Example 6

32.2 parts by mass (solid content) of prepolymer solution of the bisphenol A dicyanate obtained in Production Example 1, 42.8 parts by mass of naphthalene cresol novolac type epoxy resin (manufactured by Nippon Kayaku Co., Ltd., product name: NC-7000L, epoxy equivalent 231), 8.8 parts by mass of silica filler (manufactured by Nippon AEROSIL Co., Ltd., product name: AEROSIL R972, specific surface area 110 $m^2/g$) as inorganic filler, and 86.5 parts by mass of dimethyl acetamide based on 100 parts by mass as a total mass of varnish to be obtained, as an organic solvent were blended, and were stirred at room temperature until resin components were dissolved. Thereafter, through dispersion by a nanomizer treatment, a varnish 7 to be used for producing an adhesion auxiliary layer was obtained.

Next, the varnish 7 was applied on a PET film (thickness 38 μm) as a support by using a comma coater such that the resulting dried adhesion auxiliary layer had a thickness of 3 μm, and then dried at 140° C. for 3 min so that the adhesion auxiliary layer was formed on the PET film. Subsequently, the varnish 1 produced in Example 1 was applied on the adhesion auxiliary layer obtained above by using a comma coater such that the resulting dried interlayer insulating resin film had a thickness of 40 μm, and then dried at 140° C. for 2 min. Subsequently, through winding-up in a roll form, a polypropylene film having a thickness of 15 μm as a protective film was stuck to the surface of the interlayer insulating resin film opposite to the support, so that an adhesion auxiliary layer-attached interlayer insulating resin film having the support and the protective film was obtained.

Examples 7 to 10, Comparative Example 2

Adhesion auxiliary layer-attached interlayer insulating resin films having a support and a protective film each was obtained in the same manner as in Example 6, except that the varnish 1 in Example 6 to be applied on the adhesion auxiliary layer was changed to a varnish shown in Table 2.

[Production of Resin Plate]

A resin plate to be used for measuring a glass transition temperature, a thermal expansion coefficient, and a dielectric loss tangent was prepared by the following procedure.

(I) From the interlayer insulating resin film having a support and a protective film, which was obtained in each of Examples 1 to 5, and Comparative Example 1, the protective film was peeled off, and drying was performed at 110° C. for 10 min.

Next, the dried interlayer insulating resin film having the support was laminated on a glossy surface of a copper foil (electric field copper foil, thickness 12 μm) by using a vacuum pressure-type laminator (manufactured by Meiki Co., Ltd., product name: MVLP-500/600-II) such that the interlayer insulating resin film was in contact with the copper foil. Then, a laminate (1) was obtained in which the copper foil, the interlayer insulating resin film, and the support were laminated in this order. The lamination was performed by a method in which after depressurization for 30 sec, pressing was performed at 140° C. for 30 sec under press-bonding pressure of 0.5 MPa. Then, from the laminate (1), the support was peeled off.

(II) Next, the same interlayer insulating resin film having a support and a protective film, as the interlayer insulating resin film having a support and a protective film used in the above (I) was prepared. After the protective film was peeled off, drying was performed in the same manner as the above (I).

(III) Next, the laminate (1) from which the support was peeled off, which was obtained in the above (I), and the dried interlayer insulating resin film having the support, which was obtained in the above (II), were laminated under the same conditions as the above (I) such that the interlayer insulating resin films were in contact with each other. A laminate (2) was obtained in which the copper foil, a layer composed of two layers of interlayer insulating resin films, and the support were laminated in this order. Then, from the laminate (2), the support was peeled off.

(IV) Next, the laminate (2) from which the support was peeled off, which was obtained in the above (III), and the dried interlayer insulating resin film having the support, which was obtained by the same method as the above (II), were laminated under the same conditions as the above (I) such that the interlayer insulating resin films were in contact with each other. A laminate (3) was obtained in which the copper foil, a layer composed of three layers of interlayer insulating resin films, and the support were laminated in this order.

(V) A laminate (2) was produced in the same manner as the above (I) to (III).

(VI) The support of each of the laminate (2) obtained in the above (V) and the laminate (3) obtained in the above (I) to (IV) was peeled off, and the interlayer insulating resin films of the laminate (2) and the laminate (3) were stuck to each other. Then, press molding was performed using a vacuum press at 175° C., for 60 min under a press-bonding pressure of 1.0 MPa. The obtained double-side copper foil-attached resin plate was cured at 190° C. for 2 hours, and the copper foil was etched with ferric chloride. Thus, a resin plate having a thickness of about 0.2 mm was obtained.

[Measurement Method of Glass Transition Temperature]

A glass transition temperature was measured by using a dynamic viscoelasticity measuring device (manufactured by UBM Corporation, product name: DVE-V4). The resin plate produced as described above was cut out with a width of 5 mm, a length of 30 mm, and attached to a detector. Measurement was made under measurement conditions of a heating rate of 5° C./min, a frequency of 10 Hz, and a measurement temperature ranging from 40° C. to 350° C., and a temperature at which a loss modulus is maximized was determined as a glass transition temperature. The results are shown in Table 2. A higher glass transition temperature indicates that a heat resistance is excellent.

[Measurement Method of Thermal Expansion Coefficient]

A thermal expansion coefficient was measured by using a thermomechanical analyzing device (manufactured by TA Instruments, product name: TMA2940), through a tensile loading method. The resin plate produced as described above was cut out with a width of 3 mm and a length of 20 mm, and attached to a detector. Measurement was continuously made twice under measurement conditions of a load of 0.05 N, a heating rate of 10° C./min, and a measurement temperature from −30° C. to 300° C. An average thermal expansion coefficient (ppm) at 25° C. to 150° C. at the second measurement was calculated. The results are shown in Table 2. A lower thermal expansion coefficient indicates that a low thermal expansion property is excellent.

[Measurement Method of Dielectric Loss Tangent]

The resin plate produced as described above was cut out as a test piece with a width of 2 mm and a length of 70 mm, and the dielectric loss tangent was measured by using a network analyzer (manufactured by Agilent•Technologies Inc., product name: E8364B) and a cavity resonator corresponding to 5 GHz. The measurement temperature was set to 25° C. The results are shown in Table 2. A lower dielectric loss tangent indicates that the dielectric property is excellent.

[Measurement Method of Adhesion Strength to Circuit Board]

In evaluating an adhesion strength to a circuit board, a substrate for adhesion strength evaluation was produced by the following procedure.

(1) Substrate Treatment of Laminate Plate

Both surfaces of a double-sided copper-clad laminate plate (manufactured by Hitachi Chemical Co., Ltd., product name: E-700GR, copper foil thickness: 12 µm, substrate thickness: 0.4 mm) were etched with ammonium persulfate, to obtain a substrate from which copper was removed.

(2) Substrate Treatment of Copper Foil

The glossy surface of an electrolytic copper foil (manufactured by Nippon Denkai Ltd., product name: YGP-35, 35 µm thickness) was immersed in "MECetchBOND CZ-8101" (product name) manufactured by MEC Co., Ltd., and was subjected to a roughening treatment until an etching amount reached 1 µm. Further, in the present specification, in some cases, performing a roughening treatment by immersion in "MECetchBOND CZ-8101" (product name) manufactured by MEC Co., Ltd. is referred to as "CZ treatment."

(3) Lamination of Interlayer Insulating Resin Film

From the interlayer insulating resin film having a support and a protective film, which was produced in Examples 1 to 5 and Comparative Example 1, the protective film was peeled off. The obtained interlayer insulating resin film having the support was laminated on a CZ-treated surface of the copper foil subjected to the CZ treatment in the above (2), by using a batch-type vacuum pressure laminator (manufactured by Meiki Co., Ltd.), such that the interlayer insulating resin film was in contact with the CZ-treated surface. The lamination was performed by a method in which after depressurization for 30 sec, pressing was performed at 100° C., for 30 sec, under press-bonding pressure of 0.5 MPa.

(4) Curing of Interlayer Insulating Resin Film

From the interlayer insulating resin film laminated in the above (3), the support was peeled off, and the interlayer insulating resin film was cured at 190° C. for 2 hours, by using an explosion proof dryer. A laminate plate, which has an interlayer insulating layer obtained by curing the interlayer insulating resin film, and a copper layer as a conductor layer, was obtained.

(5) Press Molding

The substrate obtained in the above (1), a prepreg (manufactured by Hitachi Chemical Co., Ltd., product name: E-679FG) for the purpose of bonding, and the laminate plate obtained in the above (4), were laminated in order of the substrate, the prepreg, the interlayer insulating layer, and the copper layer, and the press molding was performed by using a vacuum press at 180° C. for 60 min under a press-bonding pressure of 1.5 MPa to obtain a measurement substrate on which a peel measurement section is not yet produced.

(6) Production of Peel Measurement Section

On the copper layer of the measurement substrate obtained in the above (5), resist with a width of 10 mm was formed, and the copper layer was etched with ferric chloride. Thus, a substrate for adhesion strength evaluation which has the copper layer with a width of 10 mm as a peel measurement section was obtained.

By using the above-obtained substrate for adhesion strength evaluation, measurement of an adhesion strength between the interlayer insulating layer and the copper layer was performed by the following method.

When one end of the copper layer in the peel measurement section was peeled off at an interface between the copper layer and the interlayer insulating layer, and gripped with a gripper, and then peeled off in the vertical direction at a tensile speed of 50 mm/min, at room temperature, the load was measured.

Further, the same sample was subjected to an accelerated environmental test by a highly accelerated lifetime device (manufactured by ESPEC Corporation), under conditions of 130° C. and 85% RH for 100 hours, and then, the adhesion strength was measured in the same manner. Thus, the adhesion strength after the accelerated environmental test was measured. A retention rate (%) of the adhesion strength was calculated by the following equation from the adhesion strengths before and after the accelerated environmental test, so that the adhesion strengths were compared before and after the accelerated environmental test. The results are shown in Table 2.

Retention rate (%) of adhesion strength=(adhesion strength after accelerated environmental test/adhesion strength before accelerated environmental test)×100

[Measurement Method of Surface Roughness]

In measuring surface roughness, a substrate for surface roughness measurement was produced by the following procedure.

The adhesion auxiliary layer-attached interlayer insulating resin film having a support and a protective film, which was obtained in Examples 6 to 10, and Comparative Example 2, was cut into a size of 250 mm×250 mm, and then the protective film was peeled off.

The obtained adhesion auxiliary layer-attached interlayer insulating resin film having the support was laminated on a printed wiring board (manufactured by Hitachi Chemical Co., Ltd., product name: E-700GR) subjected to a CZ treatment, by using a vacuum pressure-type laminator (manufactured by Meiki Co., Ltd., product name: MVLP-500/600-II), such that the interlayer insulating resin film was in contact with the printed wiring board. The lamination was performed by a method in which after depressurization for 30 sec, pressing was performed at 100° C. for 30 sec under press-bonding pressure of 0.5 MPa.

Then, after cooling to room temperature, the support was peeled off and removed. Next, the printed wiring board on which the corresponding adhesion auxiliary layer-attached interlayer insulating resin film was arranged was dried at 130° C. for 20 min, and then, further cured at 175° C. for 40 min, in an explosion proof dryer, to obtain the printed wiring board formed with an interlayer insulating layer. The corresponding printed wiring board was cut out into 30 mm×40 mm to obtain a test piece.

The test piece obtained above was immersed in a swelling liquid (manufactured by Rohm and Haas Electronic Materials Co., Ltd., product name: CIRCUPOSIT MLB CONDITIONER211) heated to 80° C. for 3 min. Next, immersing was performed in a roughening liquid (manufactured by Rohm and Haas Electronic Materials Co., Ltd., product name: CIRCUPOSIT MLB PROMOTER213) heated to 80° C. for 8 min. Subsequently, neutralization was performed through immersing in a neutralizing liquid (manufactured by Rohm and Haas Electronic Materials Co., Ltd., product name: CIRCUPOSIT MLB NEUTRALIZER MLB216) heated to 45° C. for 5 min. In this manner, the test piece, in which the surface of the interlayer insulating layer was subjected to a roughening treatment, was used as a substrate for surface roughness measurement.

The surface roughness of the above-obtained substrate for surface roughness measurement was measured by using a specific contact type surface roughness meter (manufactured by Bruker AXS Corporation, product name: wykoNT9100), with an internal lens of one time and an external lens of 50 times, to obtain an arithmetic average roughness (Ra). The results are shown in Table 3. From the gist of the present invention, Ra is preferably smaller, and the case of less than 200 nm is suitable in formability of fine wiring.

[Measurement Method of Adhesion Strength to Plated Copper]

In measuring an adhesion strength to a plated copper, a substrate for measurement of adhesion strength to a plated copper was produced by the following procedure.

First, the above-described substrate for surface roughness measurement was cut out into 40 mm×60 mm to obtain a test piece.

The corresponding test piece was treated with an alkaline cleaner (manufactured by Atotech Japan Co., Ltd., product name: Cleaner Securiganth 902) at 60° C. for 5 min, and the degreased and washed. After washing, treatment was performed with a pre-dip solution (manufactured by Atotech Japan Co., Ltd., product name: Pre Dip Neoganth B) at 23° C. for 2 min. Then, treatment was performed with an activator solution (manufactured by Atotech Japan Co., Ltd., product name: activator Neoganth 834) at 40° C. for 5 min so that a palladium catalyst was deposited. Then, treatment was performed with a reducing solution (manufactured by Atotech Japan Co., Ltd., product name: reducer Neoganth WA) at 30° C. for 5 min.

The test piece subjected to the above-described treatments was placed in a chemical copper solution (manufactured by Atotech Japan Co., Ltd., product name: basic printoganth MSK-DK), and electroless plating was performed until plating thickness on the interlayer insulating layer reached about 0.5 μm. After the electroless plating, baking was carried out at 120° C. for 15 min so that stress remaining in the plated film is relieved and a residual hydrogen gas is removed.

Next, for the test piece subjected to the electroless plating treatment, further, electrolytic plating was performed until plating thickness on the interlayer insulating layer reached 30 μm so that a copper layer as a conductor layer was formed. After the electrolytic plating, through heating at 190° C. for 90 min, and curing, a measurement substrate on which a peel measurement section is not yet produced was obtained.

On the copper layer of the obtained measurement substrate, resist with a width of 10 mm was formed, and the copper layer was etched with ammonium persulfate. Thus, a substrate for measurement of adhesion strength to a plated copper, which has the copper layer with a width of 10 mm as a peel measurement section, was obtained.

As a measurement method of adhesion strength to a plated copper, the same method as the above-described measurement method of adhesion strength to a circuit board was performed. The results are shown in Table 3.

[Reflow Heat Resistance]

In measuring a reflow heat resistance, a substrate for reflow heat resistance measurement was produced by the following procedure.

From the adhesion auxiliary layer-attached interlayer insulating resin film having a support and a protective film, which was obtained in Examples 6 to 10, and Comparative Example 2, the protective film was peeled off. The obtained adhesion auxiliary layer-attached interlayer insulating resin film having the support was laminated on both surfaces of a printed wiring board (manufactured by Hitachi Chemical Co., Ltd., product name: MCL-E-679(R), thickness 0.4 mm, copper thickness 12 μm, inner layer circuit pattern portion) having a conductor layer subjected to CZ treatment, such that the interlayer insulating resin film was in contact with the conductor layer of the printed wiring board. The lamination was performed by a method in which after depressurization for 30 sec, pressing was performed at 100° C. for 30 sec under press-bonding pressure of 0.5 MPa.

Then, after cooling to room temperature, the supports on both surfaces were peeled off and removed, and a printed wiring board having the interlayer insulating resin films arranged on both surfaces thereof was obtained. Next, the corresponding printed wiring board having the interlayer insulating resin films arranged on both surfaces thereof was dried at 130° C. for 20 min, and then, further cured at 175° C. for 40 min, in an explosion proof dryer to obtain the printed wiring board having interlayer insulating layers formed on both surfaces thereof. For the obtained printed wiring board, roughening treatment, electroless plating, and electrolytic plating were performed under the same conditions as for the above-described substrate for measurement of adhesion strength to a plated copper. Thereafter, through post-curing at 190° C. for 2 hours, a substrate for reflow heat resistance measurement was obtained.

The substrate for reflow heat resistance measurement was passed through a reflow furnace of 265° C. (manufactured by TAMURA Corporation, feed speed of 0.61 m/min), the number of times of pass was measured four times until blistering (blister) occurred, and the average number of times was set as an index of reflow heat resistance. The results are shown in Table 3. The larger average number of times indicates that a reflow heat resistance is excellent.

TABLE 2

| | | | Example 1 | Example 2 | Example 3 | Example 4 | Example 5 | Comparative Example 1 |
|---|---|---|---|---|---|---|---|---|
| | Varnish number | | 1 | 2 | 3 | 4 | 5 | 6 |
| | Epoxy resin (A) | NC-7000L | 8.4 | 8.4 | 8.4 | 8.4 | 8.4 | 8.4 |
| | | NC-3000H | 10.5 | 10.5 | 10.5 | 10.5 | 10.5 | 10.5 |
| | Cyanate resin (B) | Cyanate prepolymer obtained in Production Example 1 | 8.4 | 8.4 | 8.4 | 8.4 | 8.4 | 8.4 |
| | Dicyandiamide (C) | | 0.015 | 0.046 | 0.076 | 0.152 | 0.301 | 0 |
| | Inorganic filler (D) | SC-2050-KNK | 51.2 | 51.2 | 51.2 | 51.2 | 51.2 | 51.2 |
| Blending | | SC-2050-KC | 17.1 | 17.1 | 17.1 | 17.1 | 17.1 | 17.1 |
| amount | Other components | Para cumyl phenol | 1.0 | 1.0 | 1.0 | 1.0 | 1.0 | 1.0 |
| (part by | | YL-7213B | 1.6 | 1.6 | 1.6 | 1.6 | 1.6 | 1.6 |
| mass) | Flame retardant | PX-200 | 1.7 | 1.7 | 1.7 | 1.7 | 1.7 | 1.7 |
| | Antioxidant | YOSHINOX BB | 0.08 | 0.08 | 0.08 | 0.08 | 0.08 | 0.08 |
| | Flow adjusting agent | BYK310 | 0.08 | 0.08 | 0.08 | 0.08 | 0.08 | 0.08 |
| | Organic curing accelerator | 2PZ-CN | 0.02 | 0.02 | 0.02 | 0.02 | 0.02 | 0.02 |
| | Metallic curing accelerator | Zinc naphthenate | 0.002 | 0.002 | 0.002 | 0.002 | 0.002 | 0.002 |
| Content of dicyanamide (C) | | (part by mass) *1 | 0.05 | 0.17 | 0.28 | 0.56 | 1.10 | 0 |
| | | (equivalent) *2 | 0.01 | 0.03 | 0.05 | 0.10 | 0.20 | 0 |
| Evaluation results | Heat resistance | Glass transition temperature (° C.) | 181 | 180 | 182 | 180 | 181 | 180 |
| | Low thermal expansion property | Thermal expansion coefficient (ppm) | 22.0 | 23.1 | 22.2 | 22.5 | 21.9 | 22.4 |
| | Dielectric property | Dielectric loss tangent | 0.0072 | 0.0074 | 0.0077 | 0.0080 | 0.0084 | 0.0070 |
| | Adhesion strength to circuit board | Before accelerated environmental test (kgf/cm) | 0.53 | 0.54 | 0.48 | 0.46 | 0.40 | 0.48 |
| | | After accelerated environmental test (kgf/cm) | 0.13 | 0.17 | 0.25 | 0.29 | 0.21 | 0.05 |
| | | Retention rate of adhesion strength (%) | 25 | 31 | 52 | 63 | 353 | 10 |

1*: content based on a total of 100 parts by mass of epoxy resin (A) and cyanate resin (B) in terms of solid content.
2*: equivalent of dicyandiamide (c) to epoxy resin (A)
[(blending amount of dicyandiamide (C)/active hydrogen equivalent to dicyandiamide (C))/(blending amount of epoxy resin (A)/epoxy equivalent of epoxy resin (A))]

Details of compounds described in Table 2 are as follows.

NC-7000L: naphthalene type epoxy resin, manufactured by Nippon Kayaku Co., Ltd., product name: NC-7000L, epoxy equivalent 231

NC-3000H: aralkyl type epoxy resin, manufactured by Nippon Kayaku Co., Ltd., product name: NC-3000H, epoxy equivalent 289

Dicyandiamide: manufactured by Kanto Chemical Co., Inc.

SC-2050-KNK: silica filler subjected to an aminosilane coupling agent treatment, manufactured by Admatechs Co., Ltd., product name: SC-2050-KNK SC-2050-KC: silica filler subjected to a silicon oligomer coupling agent (manufactured by Hitachi Chemical Co., Ltd., product name: SC6000) treatment, manufactured by Admatechs Co., Ltd., product name: SC-2050-KC Para cumyl phenol: p-(α-cumyl)phenol, manufactured by Tokyo Chemical Industry Co., Ltd, molecular weight 212

YL-7213B: phenoxy resin, manufactured by Mitsubishi Chemical Corporation, product name: YL7213B PX-200: 1,3-phenylenebis(di2,6-xylenylphosphate), manufactured by Daihachi Chemical Industry Co., Ltd., product name: PX-200

YOSHINOX BB: 4,4'-butylidenebis-(6-t-butyl-3-methylphenol), manufactured by Mitsubishi Chemical Corporation, product name: YOSHINOX BB BYK310: manufactured by BYG Chemi Japan Co., Ltd., product name: BYK310

2PZ-CN: 1-cyanoethyl-2-phenylimidazole, manufactured by Shikoku Chemicals Corporation, product name: 2PZ-CN Zinc naphthenate: manufactured by Wako Pure Chemical Corporation From Table 2, as compared to Comparative Example 1, in Examples 1 to 5, a glass transition temperature, a thermal expansion coefficient, and a dielectric loss tangent are maintained. Further, it can be found that Examples 1 to 5 are excellent in adhesiveness to copper foil even after an accelerated environmental test, in evaluation of adhesion strength to a circuit board. Accordingly, even in the case where the interlayer insulating resin film of the present invention is laminated on a circuit board, so that an interlayer insulating layer is formed, it can be found that there is a good adhesion strength between a conductor layer (a copper layer) of the circuit board and the interlayer insulating layer, even after an accelerated environmental test. That is, it can be found that by the interlayer insulating resin film of the present invention, it is possible to obtain an interlayer insulating layer that is excellent in adhesiveness to a circuit board, and also excellent in a low thermal expansion property, a heat resistance, and a dielectric property.

TABLE 3

|  |  | Example 6 | Example 7 | Example 8 | Example 9 | Example 10 | Comparative Example 12 |
|---|---|---|---|---|---|---|---|
| Number of varnish used for forming interlayer insulating resin film | | 1 | 2 | 3 | 4 | 5 | 6 |
| Evaluation results | Surface roughness (Ra) (nm) | 183 | 190 | 194 | 192 | 185 | 180 |
| | Adhesion strength to plated copper (kgf/cm) | 1.0 | 0.9 | 1.0 | 1.0 | 1.0 | 1.0 |
| | Reflow heat resistance (times) | 10 | 15 | 18 | 20 | 21 | 5 |

From Table 3, it can be found that as compared to Comparative Example 2, in Examples 6 to 10 using the adhesion auxiliary layer-attached interlayer insulating resin film of the present invention, an interlayer insulating layer excellent in a reflow heat resistance is obtained while a surface roughness, and an adhesion strength to a plated copper are maintained.

INDUSTRIAL APPLICABILITY

The adhesive film of the first invention is useful for an adhesive film for a multilayer printed-wiring board because even when silica filler is highly filled, the property of filling irregularities is excellent.

The interlayer insulating resin film of the second invention may provide an interlayer insulating layer that is excellent in a low thermal expansion property, a heat resistance, and a dielectric property, in which adhesiveness to a circuit board is less reduced particularly even after an accelerated environmental test. Accordingly, the interlayer insulating resin film of the second invention is useful for electric products such as computers, mobile phones, digital cameras, and televisions, and vehicles such as motorcycles, automobiles, electric trains, ships, and aircraft.

The invention claimed is:

1. An interlayer insulating resin film containing an epoxy resin (A), a cyanate resin (B), dicyandiamide (C) and particulate inorganic filler (D),
    wherein a content of the epoxy resin (A) in the interlayer insulating resin film is in a range from 5 parts to 30 parts by mass based on 100 parts by mass of non-volatile components contained in the interlayer insulating resin film; a content of the cyanate resin (B) in the interlayer insulating resin film is in a range from 2 to 50 parts by mass based on 100 parts by mass of non-volatile components contained in the interlayer insulating resin film, a content of the dicyandiamide (C) in the interlayer insulating resin film is in a range of 0.005 to 5.0 parts by mass based on a total of 100 parts by mass of the epoxy resin (A) and the cyanate resin (B) in terms of content of non-volatile components, a (blending amount of dicyandiamide (C)/active hydrogen equivalent of dicyandiamide (C))/(blending amount of epoxy resin (A)/epoxy equivalent of epoxy resin (A)) is in a range from 0.005 to 0.5, and a content of the particulate inorganic filler (D) is in a range from 150 to 500 parts by mass based on 100 parts by mass of resin components in the interlayer insulating resin film in terms of content of non-volatile components, and
    wherein the particulate inorganic filler (D) is at least one filler selected from the group consisting of silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, bismuth titanate, titanium oxide, barium zirconate, and calcium zirconate.

2. The interlayer insulating resin film according to claim 1, wherein the particulate inorganic filler (D) is silica.

3. An adhesion auxiliary layer-attached interlayer insulating resin film that is an interlayer insulating resin film attached with an adhesion auxiliary layer, in which the adhesion auxiliary layer is formed on one surface of the interlayer insulating resin film according to claim 1, and the corresponding adhesion auxiliary layer contains an epoxy resin (a), a cyanate resin (b), and an inorganic filler (c).

4. The adhesion auxiliary layer-attached interlayer insulating resin film according to claim 3, further comprising a support further formed on the surface of the adhesion auxiliary layer opposite to the surface on which the interlayer insulating resin film is formed.

5. A printed wiring board obtained by using the adhesion auxiliary layer-attached interlayer insulating resin film according to claim 4.

6. A printed wiring board obtained by using the adhesion auxiliary layer-attached interlayer insulating resin film according to claim 3.

7. A printed wiring board obtained by using the interlayer insulating resin film according to claim 1.

8. The interlayer insulating resin film according to claim 1, wherein a thickness of the interlayer insulating resin film is in a range from 10 μm to 100 μm.

9. The interlayer insulating resin film according to claim 1, further comprising a support, the interlayer insulating resin film being provided on the support, and a protective film provided on a surface of the interlayer insulating resin film on an opposite side to the support.

10. The interlayer insulating resin film according to claim 9, wherein the interlayer insulating resin film is wound in a roll form.

11. The interlayer insulating resin film according to claim 10, wherein the interlayer insulating resin film is in an uncured state obtained by drying, or in a semi-cured (B-staged) state.

12. The interlayer insulating resin film according to claim 9, wherein the interlayer insulating resin film is in an uncured state obtained by drying, or in a semi-cured (B-staged) state.

13. The interlayer insulating resin film according to claim 1, wherein the particulate inorganic filler (D) has an average particle size of 0.1 μm or more.

14. The interlayer insulating resin film according to claim 13, wherein the particulate inorganic filler (D) has an average particle size of 5 μm or less.

15. The interlayer insulating resin film according to claim 1, wherein the interlayer insulating resin film is in an uncured state obtained by drying, or in a semi-cured (B-staged) state.

16. The interlayer insulating resin film according to claim 1, wherein the particulate inorganic filler (D) has an average particle size of 5 μm or less.

17. The interlayer insulating resin film according to claim 1, wherein the content of the particulate inorganic filler (D) is in a range from 150 to 300 parts by mass based on 100 parts by mass of resin components in the interlayer insulating resin film in terms of content of non-volatile components.

* * * * *